United States Patent [19]

Muraoka et al.

[11] Patent Number: 5,665,987
[45] Date of Patent: Sep. 9, 1997

[54] INSULATED GATE STATIC INDUCTION THYRISTOR WITH A SPLIT GATE TYPE SHORTED CATHODE STRUCTURE

[75] Inventors: Kimihiro Muraoka; Yoshinobu Ohtsubo, both of Kanagawa-ken; Toshio Higuchi, Tokyo; Makoto Iguchi, Kanagawa-ken; Takashige Tamamushi, 2-18-17, Shimoochiai, Shinjuku-Ku, Tokyo, 161, all of Japan

[73] Assignees: Toyo Denki Seizo Kabushiki Kaisha; Takashige Tamamushi, both of Tokyo, Japan

[21] Appl. No.: 414,346

[22] Filed: Mar. 31, 1995

Related U.S. Application Data

[63] Continuation of Ser. No. 140,763, Oct. 21, 1993, abandoned.

[30] Foreign Application Priority Data

Oct. 27, 1992 [JP] Japan ................... 4-311261

[51] Int. Cl.$^6$ ................... H01L 29/74; H01L 31/111
[52] U.S. Cl. ................... 257/133; 257/136; 257/152; 257/154; 257/162
[58] Field of Search ................... 257/133, 136, 257/152, 154, 162

[56] References Cited

U.S. PATENT DOCUMENTS 5,198,687  3/1993  Baliga ................... 257/137

OTHER PUBLICATIONS

Switching Characteristics of an IEE of Japan, Oct. 26, 1990 SI Thyristor With a Shorted Structure.

*Primary Examiner*—Ngân V. Ngô
*Attorney, Agent, or Firm*—McGlew and Tuttle

[57] ABSTRACT

In a gate insulated static induction thyristor with a split gate type shorted cathode structure, a first gate of the split gate structure is used as a cathode short-circuit gate and the cathode region is formed in the second gate. A MOS structure is formed on the second gate as a control gate electrode isolated therefrom. Since the channel integration density is high, the area efficiency increases. The MOS gate structure suppresses the minority carrier (hole) storage effect to permit high-speed swtching of the thyristor, and the shorted cathode structure provides for increased maximum controllable current/voltage durability. The split gate structure can be used in combination with planar, buried, recessed and double gate structures.

19 Claims, 14 Drawing Sheets

→ HOLE CURRENT
--→ ELECTRON CURRENT

→ HOLE CURRENT AT ON-STATE
---→ ELECTRON CURRENT AT ON-STATE

⟶ HOLE CURRENT
---⟶ ELECTRON CURRENT
—·—·⟶ HOLE BY-PASS CURRENT

INSULATED GATE STATIC INDUCTION THYRISTOR WITH A SPLIT GATE TYPE SHORTED CATHODE STRUCTURE

This is a continuation of application Ser. No. 08/140,763 filed Oct. 21, 1993, now abandoned.

BACKGROUND OF THE INVENTION

1. Field of the Invention

The present invention relates to power semiconductor device and, more particularly, to an insulated gate static induction thyristor with a split gate type shorted cathode structure wherein a first gate (a shielding gate) is shorted to a cathode region formed in a second gate and an insulated gate formed over the second gate is used as a control gate electrode to enhance its isolation from a cathode short-circuit gate, thereby increasing the maximum controllable current/voltage durability of the device and permitting its high-speed switching.

2. Description of the Prior Art

It is well-known in the art that the above-mentioned maximum controllable current/voltage durability of a conventional thyristor, GTO, or similar device could be enhanced by the introduction thereinto of a shorted cathode structure. As for a static induction thyristor with a shorted cathode structure, there has been proposed a device structure for a planar gate type SI thyristor and it has been reported that speedup of device operation could be implemented without shortening the carrier life time in the device by the use of a double emitter-shorted structure combined with a shorted anode structure. FIG. 25 is a sectional view schematically showing the internal construction of an SI thyristor with a double emitter-shorted structure disclosed in "Switching Characteristics of an SI Thyristor with a Shorter Structure" EDD-90-59, SPC-90-58 presented in Joint Meeting on Electron Devices and Semiconductor Power Conversion, IEE of Japan.

In FIG. 25 reference numeral 1 denotes a p$^+$-type anode region, 2 an n$^+$-type cathode region, 3 a p$^+$-type gate region, 4 a cathode short-circuit region, 5 a high-resistivity region, 6 an n$^+$-type static induction short-circuit region, 7 an anode electrode, 8 a chathode elctrode, 9 a gate electrode, 10 a cathode short-circuit electrode, and 11 an oxide film.

In the conventional shorted cathode structure, as shown in FIG. 25, the cathode short-circuit region 4 is provided separately of the p$^+$-type gate region 3 so that holes to be absorbed into the p$^+$-type gate region 3 are partly absrobed by the cathode short-circuit region 4 to essentially reduce the hole density near the cathode side. Since the cathode short-circuit region 4 is spaced a predetermined distance apart from the p$^+$-type gate region 3, however, the areas of the cathode region 2 and the p$^+$-type gate region 3 are smaller the in a thyristor structure employing a common gate, and hence the area efficiency decreases accordingly. The decrease in the area of the cathode region 2 will cause a corresponding decrease in the current capacity of the thyristor as well. Hence, this prior art example is so low in area efficiency that it is not suited to providing a large current by a multi-channel structure of the device.

In Japanese Patents NO. 1588399 entitled "Static Induction Thyristor" and No. 1456781 entitled "Double Gate Type Static Induction Thyristor" there are disclosed split gate type SI thyristors of the type wherein a gate region surrounding a channel is split into a plurality of gates and one of them is used as a driving gate to sufficiently reduce the electrostatic capacitance viewed from the gate, permitting high-speed switching of large current. Yet, these patents disclose only enhancement of the function of a control gate by dividing the gate but does not ever disclose the shorted cathode structure which positively enhances the function of a non-control gate to improve the maximum controllable current/voltage durability.

A split gate type static induction transistor is also disclosed in Japanese Patent No. 1302727 entitled "Static Induction Transistor and Semiconductor Integrated Circuit," for instance; but the invention disclosed in the patent is directed to transistors and is applied to integrated circuits that operate at low voltages. Although the invention permits improvement of the function of the control gate, nothing is disclosed about measures for improving the function of the non-control gate. Moreover, the patent does not ever disclose anything about a shorted source structure that corresponds to the shorted cathode structure according to the present invention. The reason for this is that the non-control gate is not so important because of the split gate structure of the transistor.

On the other hand, a semiconductor imaging device that utilizes the split gate type transistor as one pixel (a picture element) has also been proposed and is disclosed in Japanese Pat. Publication Gazette No. 37028/89. In this imaging device, the gate is split into a control gate and a shielding gate; the shielding gate is used as a region for device isolation and shields against irradiation by light, and the control gate is used as an ordinary gate and is covered with a capacitor that is used to store optical information.

In the above-mentioned Publication Gazette there are proposed, with a view to separating the functions of the two gate regions, a structure in which the distance between the shielding gate region and the source (drain) region formed as a main electrode in the wafer surface is short and a structure in which the shielding gate region is formed deep.

However, such structures for isolating the functions of split gates have not been proposed for semiconductor devices that operate under high withstand voltage, large current and high intensity electric field conditions, such as thyristors. In the case of the avobe-mentioned imaging device or split gate type static induction transistor, the voltage that is applied to the main electrode is as low as 5 volts or so and conducting carriers are electrons (in the case of an n-chennel device). The effect of storage of holes that are carriers injected from an pn junction control gate is less than in the case of using an common gate. In the split gate type static induction thyristor, however, conducting carriers are both electrons and holes and there are holes injected from the anode region into the cathode region as well as holes injected from the control gate that have an influence on the moinority carrier storage effect in the vicinity of the cathode side, in particular. In conventional split gate type static induction thyristors there have not been taken any measures for solving a problem such as how to control the hole current from the anode region by the shielding gate to increase the maximum controllable current/voltage durability.

The use of the split gate structure reduces the quantity of holes that are injected from the control gate, but the holes that are injected into the cathode region are mostly those from the anode region.

In connection with split gate type static induction thyristors, it is well-known that splitting of the gate reduces the input capacitance and increases the mutual conductance Gm at the time of electron injection from the cathode region, a decrease in the RC time constant by the reduced input capacitance providing high-speed turn-OFF performance; but no structure has been proposed which improves the turn-OFF performance by separating the functions of the split gates to provide for increased maximum controllable current/voltage durability. Nor has there been proposed any structure wherein the holes injected from the anode side are positively flowed into the shielding gate region to lighten the burden on the control gate and prevent the turn-OFF characteristic from being suppressed by the minority carrier storage effect near the cathode side.

To solve the above-mentioned defects of the prior art, the inventors of this application have previously proposed, in Japanese Pat. Appln. No.289244/92, a static induction thyristor with a shorted cathode structure wherein first and second gates are both formed as pn junction gates. The static induction thyristor disclosed in the above-said prior application is a static induction thyristor with a split gate type shorted cathode structure which lessens the minority carrier (hole) storage effect near the cathode side to attain high-speed turn-OFF performance, increase the maximum controllable current/voltage durability and permit high-speed switching.

More specifically, the channel is surrounded by two split gates, one used as a control gate and the other as a cathode short-circuit gate electrically shorted to the cathode. As compared with conventional structures, this structure provides a high channel integration density and consequently a high area efficiency, lessens the minority carrier storage effect to increase the switching speed, and increases the maximum controllable current/voltage durability by the cathode short-circuit effect.

The static induction thyristor with a split gate type shorted cathode structure, disclosed in the above-mentioned prior application, has an anode region, a cathode region and a control region formed with a high-resistivity region interposed therebetween. The control region includes first and second gate regions separated from each other. A shield gate electrode formed in contact with the first gate region and a cathode electrode formed in contact the cathode region are electrically shorted to form a shorted cathode structure. A current flow between the cathode region and the anode region is controlled by a voltage that is applied to a control gate electrode formed in contact with the second gate region. In the high-resistivity layer adjoining the cathode region there are formed a first depletion layer by the diffusion potential between the first gate region and the high-resistivity layer and a second depletion layer by the diffusion potential between the second gate region and the high-resistivity layer. At the same time, a potential barrier, which is conrollable with a static induction effect by the voltage of the control gate electrode that is applied to the second gate region, is formed in the high-resistivity layer near the boundary between the first and second depletion layers. Holes injected from the anode region partly flow through the first gate region and into the cathode electrode shorted to the shield gate electrode.

The first gate region has an impurity concentration higher than that of the second gate region.

The distance between the first gate region and the cathode region is selected to be shorter than the distance between the second gate electrode and the cathode region; namely, the cathode region is formed closer to the first gate region than to the second gate region.

The first gate region includes a medium or low impurity concentration diffused region of the same conductivity type as that of the first gate region, formed deeper than the second gate region, and a high impurity concentration diffused region formed in the medium or low impurity concentration region.

The first gate region is formed deeper and wider than the second gate region.

The cathode region is separated from the first and second gate regions by a medium or low impurity concentration region of the same conductivity type as that of the cathode region and formed around the cathode region.

One or both of the first and second gates have a buried gate structure.

Alternatively, the first and second gate regions both have the buried gate structure, and the first and second gate region are adjacent each other.

Alternatively, one or both of the first and second gate regions have a recessed gate structure.

Alternatively, the cathode region, the anode region and the first and second gate regions are all formed in the vicinity of the same main surface of the wafer.

FIG. 26 is a schematic cross-sectional view for explaining the principle of operation of the static induction thyristor disclosed in the afore-mentioned Japanese prior application. FIG. 27 is a schematic equivalent circuit representation of the static induction thyristor shown in FIG. 26. As will be seen from FIG. 27, the operation of the static induction thyristor of FIG. 26 can be regarded as parallel operations of two thyristors since it has the split gate structure. In FIG. 26, reference numeral 1 denotes an anode region, 2 a cathode region, 31 a first gate region that is called a cathode short-circuit gate or shielding gate, 32 a second gate region that is called a control gate, 5 a high-resistivity layer, 7 an anode electrode, 8 a cathode electrode, 9 a gate electrode, 10 a cathode short-circuit electrode, and 11 an oxide ($SiO_2$) film. The gate electrode 9 is a control gate electrode, and the cathode short-circuit electrode 10 is the electrode of the cathode short-circuit gate (or shielding gate) and is essentially shorted to the cathode electrode 8.

Of course, it does not matter, theoretically, whether the gate regions 31 and 32 are pn junction gates, MIS (MOS) gates, Schottky gates, or hereto junction gates. They need only to have a gate structure that permits control of current between the cathode 2 and the anode 1 by the static induction effect. In FIG. 26, reference character $W_1$ indicates the width of a depletion layer spreading around the first gate 31 and $W_2$ the width of a depletion layer around the second gate 32. Reference character G* indicates what is called an intrinsic gate point, which corresponds to the top of a static induction barrier height. The potential barrier near the point G* acts as a barrier against holes present in the first and second gates as well as electrons in the cathode, For instance, when the thyristor is in the OFF state, a potential barrier of a sufficient height is formed near the point G* against the electrons in the cathode, while at the same time it also serves as a potential barrier against the holes in the first gate 31 and the second gate 32. Consequently, when the thyristor is in the OFF state, no electron current conducts between the anode and the cathode, and no hole current conducts between the first and second gates 31 and 32 either.

As the potential harrier height near the point G* is decreased by the application of a positive voltage to the control gate electrode 9 of the second gate 32, an electron injection from the cathode 2 begins. Holes are also injected from the second gate 32, but the quantity of holes injected is far smaller than the quantity of holes that are injected from the anode 1 afterward. Besides, the quantity of holes that are injected from each split gate is also smaller than in the case of employing a common gate, which is an advantage of the split gate structure, the carrier storage effect of the gate is small. Furthermore, since the potential barrier against the holes is present near the point G*, the hole current from the second gate 32 to the first gate 31 is mainly a displacement current accompanying capacitive coupling, and an essential conducting current is very small. As the electrons injected from the cathode 2 are stored near the interface between the anode region 1 and the high-resistivity layer 5 and the height of the potential barrier against the holes in the anode region 1 decreases accordingly, injection of holes from the anode region 1 starts. The hole current from the anode region 1 mostly flows into the first gate 31 electrically shorted to the cathode region 2, the remaining hole current flowing into the second gate 32. The rate at which the hole current flows into the first and second gates 31 and 32 is dependent of the configuration of the potential distribution by the relative potential difference between the first and second gates 31 and 32, their area ratio or their shapes such as geometrical depths. When the second gate 32 is held at a positive potential relative to the first gate 31, it is expected that the quantity of holes flowing into the first gate 31 will be essentially larger than to the second gate 32. The reason for this is that the first gate 31 is lower in potential than the second gate 32 and hence is essentially in a state in which it readily stores the holes. However, the second gate 32 that serves as a control gate is small in electrostatic capacitance, and hence is readily charged by a relatively small hole current. This is another advantage of the split gate structure. In consequence, the potential at the point G* further decreases, causing further injection of electrons and further supply of holes from the anode electrode 7 and the anode region 1. By this, the thyristor is put into a latch-up state, in which the potential at the point G* decreases, permitting the formation of a channel for electrons between the anode region 1 and the cathode region 2. On the other hand, the potential barrier against holes increases, resulting in a high potential barrier being formed between the first and second gate regions 31 and 32.

That is, substantially no hole current flows between the first and second gate regions 31 and 32. Hence, when thyristor is in the ON state, electrons from the cathode region 2 flow into the anode region 1 and thence to anode electrode 7, whereas holes from the anode region 2 flow into the first gate 31 and the cathode region 2, respectively.

Next, a description will be given of the turn-OFF operation of the thyristor. When a negative electrode is applied to the gate electrode 9, the width $W_2$ of the depletion layer spreading out from the second gate 32 into the high-resistivity layer 5 increases, the potential barrier height near the point G* increasing. As a result, the hole current that has flowed into the cathode region 2 and the first gate retion 31 from the anode region 1 so far partly flows into the negatively biased second gate region 32 and thence to the control gate electrode 9. Yet, the quantity of the hole current that flows into the second gate region 32, by-passing the first gate region 31, is far smaller than the total amount of hole current flowing into the first gate (the short-circuit gate) region 31, rather, the injection of electrons from the cathode region 2 stops, since the potential barrier height bear the point G* is instantaneously increased by the negative bias voltage applied to the second gate region 32. In this state the hole current from the anode region 1 mostly flows into the first gate (or short-circuit gate) region 1 but the quantity of this current gradually decreases. The hole current having flowed into the cathode region 2 so far flows into the negatively biased second gate (or control gate) region 32. Thus, the entire hole current is shared between the first and second gate regions 31 and 32 because of the split gate structure, and hence the amount of hole current that the control gate (or second gate) region 32 needs to control may be far smaller than in the case where a common gate structure is used. Moreover, the use of the split gate structure reduces the quantity of holes that are injected from the respective gate, and hence the minority carrier (holes) effect is lessened accordingly.

To stop the hole injection from the anode region 1 after the electron injection from the cathode region 2 has also been stopped by the restoration of the poitential barrier at the point G* to its original height by negative biasing of the second gate region 32, it is necessary to extinguish the electrons stored near the anode region 1 through structural or lifetime control and through use of a structure which stops the hole injection from the anode region 1 (an SI anode short, double gate structure, for instance) or by effecting hole lifetime control.

Since the first gate region 31 is always electrically shorted to the cathode region 2, holes near the first gate region 31 are readily absorbed thereinto. Hence, the hole storage effect near the cathode region 2 and near the first gate region 31 is insignificant. Moreover, since there is no potential difference between the first gate region 31 and the cathode region 2, the width of the depletion layer spreading between them is substantially constant, the capacitance between them undergoing little change. Hence, the capacitance between the second gate region 32 and the cathode region 2 more greatly contributes to the switching operation of the thyristor. On the other hand, the width N, of the depletion layer spreading from the first gate region 31 toward the anode region 1 undergoes a substatial change with the voltage condition in the anode region 1, and this causes a substantial change in the capacitance between the first gate region 31 and the anode region 1; it is preferable that the influence of such a large capacitance change be prevented from affecting the cathode side.

In the static induction thyristor with a shorted cathode structure, disclosed in the afore-mentioned prior Japanese patent application, the anode-to-cathode current that is controlled by the control gate (or second gate region) 32 can essentially be increased by the effect of the first gate (or short-circuit gate) region 31 which serves as a hole absorbing region, and hence the maximum controllable current durability can be expected to increase. Furthermore, the amount of hole injection from the control gate 32 is small and the number of carriers (holes) stored near the cathode region 2 during the ON state of the thyristor is also made virtually smaller by the shorted gate structure than in the case where the common gate structure is utilized. Hence, the amount of holes to be absorbed by the control gate 32 during the turn-OFF of the thyristor may be so small that the turn-OFF state could be improved. Besides, it is also expected as another advantage of the split gate structure that the turn-ON switching performance is improved by the reduction of the gate input capacitance.

With the above-described split-gate, shorted-cathode structure, it is possible to implement a static induction thyristor which is high in the area efficiency because of the high channel integration density, high in the switching speed because of the lessened minority carrier storage effect and high in the maximum controllable current/voltage durability because of the use of the shorted cathode structure. The split gate structure can be formed as a planar, buried, recessed or double gate structure, and it is applicable to medium, small and large power semiconductor devices and high withstand voltage integrated circuits as well.

In the case of using the structure wherein the first and second gate regions 31 and 32 are both formed by pn junction gates, however, it is necessary, for separating their functions, that they be formed with different impurity densities or in different sizes, for instance. On the other hand, the first gate region 31, which is formed as a pn junction gate for absorbing holes injected from the anode region 1, is indispensable to the thyristor, but the second gate region 32 as the control gate need not always be a pn junction gate, because the function of the second gate 32 as the control gate is to control the electron injection from the cathode region 2 through use of a potential barrier. Where the control gate is formed by a pn junction gate, the hole injection from the control gate incurs the storage of extra minority carriers. In addition, it is difficult to completely isolate the pn junction of the control gate from the pn junction forming the first gate region 31. In other words, the potential of the second gate region 32 is affected by the potential of the first gate region 31, and hence it is hard to attain independent controllability of the control gate 32.

In view of the above, the inventions of this application propose a novel structure that has the cathode region 2 formed virtually in the second gate region 32 and controls the injection of electrons from the cathode region 2 by an insulated gate. That is the second gate region 32 is not used intact as a control gate but instead an insulated gate formed over the second gate region 32 with an insulating film interposed therebetween is used as the control gate. With this structure, the injection of minority carriers from the control gate electrode is essentially suppressed, because of a MOS insulating layer interposed between the second gate region 32 and the control gate electrode. An electron channel region is an inversion layer in the MOS gate interface or deep channel region and its controllability is excellent because the MOS gate electrode acts as a control electrode. The inversion layer in the MOS gate interface is formed in the surface layer of the second gate region 32. Hence, it can be said that an equivalent MOSFET is formed or defined by the n-type cathode 2, the p-type second gate region 32 and the n⁻ type high-resistivity region 5. This equivalent MOSFET may also be formed at the side opposite from the first gate region 31. The high-resistivity region 5 between the first and second gate regions 31 and 32 is virtually depleted, and in this high-resistivity region 5 there may be formed, by voltage applied to the MOS gate electrode, a potential barrier controllable by the static induction effect. In this instance, the potential of the second gate region 32 will be controlled static-inductively by capacitive coupling on the basis of the potential of the first gate region. However, the MOS gate electrode and the first gate region 31 are isolated from each other substantially completely by the insulating layer formed all over the second gate region 32.

SUMMARY OF THE INVENTION

It is therefore an object of the present invention to provide an insulated gate static induction thyristor with a split-gate, shorted cathode structure which lessens the minority carrier (holes) storage effect near the cathode to provide a high-speed turn-OFF capability, enhanced maximum controllable current/voltage durability and a high-speed switching capability and which ensures isolation between the cathode short-circuit gate and the control gate.

Another object of the present invention is to provide an insulated gate static induction thyristor with a split-gate, shorted-cathode structure in which a channel is surrounded by two gate region, a first gate region is used as a cathode short-circuit gate electrically shorted to the cathode region formed in a second gate region and an insulated control gate electrode is formed all over the second gate region with an insulating layer interposed therebetween to enable control of the injection of electrons from the cathode region. With this cnstruction, the isolation between the first gate region and the control gate electrode increases, the channel intergration density and consequently the area efficiency is higher than in the prior art, the minority carrier storage effect is suppressed to increase the switching speed of the thyristor and its maximum controllable current/voltage durability is also increased by the shorted cathode structure.

The split gates mentioned in this specification are gate regions into which the common gate region surrounding in the prior art are split. Since the gate region includes a pn junction gate region and a MIS gate region and a Schottky gate resion as well, the split gates mentioned herein also include split versions of such gates. The split gates may be a combination of different gates, such as a pn junction gate and a MIS gate or Schottkty gate. In such a case, the different gates are separated functionally as well as physically. In a primary embodiment of the present invention which uses the MIS gate as the control gate and the pn junction gate as the shield (short-circuit) gate, the isolation between the short-circuit gate and the control electrode is particularly enhanced. It is also possible to split the hole control gate at the anode side as well as at the cathode side and to form a shorted anode structure for one of the split gates. In this case, there will be provided a double gate static induction thyristor with a split-gate, shorted-anode structure. In such a double gate static induction thyristor it is possible to form the first gate as a split-gate, shorted-cathode structure and the second gate as a split-gate, shorted-anode structure.

In one aspect, the present invention relates to an insulated gate static induction thyristor with a split gate type shorted cathode structure which has an anode region, a cathode region and a control region formed with a high-resistivity region interposed between them and in which: the control region includes first and second split gate regions; the cathode region is virtually included in the second gate region; a shield gate electrode formed in contact with the first gate region and a cathode electrode formed in contact with the cathode region are electrically shorted to form a shorted cathode structure; an insulated gate control electrode is formed all over the second gate region with an insulating layer interposed therebetween and a current flow between the cathode region and the anode region is controlled by a voltage that is applied to the control gate electrode; a first depletion layer by the diffusion potential between the first gate region shorted to the cathode region and the high-resistivity layer and a second depletion layer by the diffusion potential between the second gate region and the high-resistivity layer are formed in the high-resistivity layer near the cathode region, and the both depletion layers essentially contact each other, enabling the potential of the second gate region to be controlled by the potential of the first gate region in terms of capacitive coupling; and holes injected from the anode region partly flow via first gate region into the cathode electrode shorted to the shield gate electrode.

In another aspect, the present invention relates to an insulated gate static induction thyristor with a split gate type shorted cathode structure which has an anode region, a cathode region and a control region formed with a high-resistivity layer interposed between them and in which: the control region includes first and second split gate regions; the cathode region is virtually included in the second gate region; a shield gate electrode formed in contact with the first gate region and a cathode electrode formed in contact with the cathode region are electrically shorted to form a shorted cathode structure; an insulated gate control electrode is formed all over the second gate retion with an insulating layer interposed therebetween to form a virtually insulated gate transistor between the cathode region and the high-resistivity layer, and a current flow between the cathode region and the anode region is controlled by a voltage that is applied to the insulated gate control electrode; a first depletion layer by the diffusion potential between the first gate region shorted to the cathode region and the high-resistivity layer and a second depletion layer by the diffusion potential between the second gate region and the high-resistivity layer are formed in the high-resistivity layer near the cathode region, the both depletion layers essentially contact each other, and a potential barrier controllable by the static induction effect is formed, by the voltage of the control gate electrode to be applied via the insulated gate to the second gate region, in the vicinity of the high-resistivity layer where the first and second depletion layers are in contact with each other; and holes injected from the anode region partly flow via the first gate region into the cathode electrode shorted to the shield gate electrode.

In a further aspect of the present invention, an auxiliary cathode region of the same conductivity type as that of the cathode region is formed in a region of the high-resistivity layer sandwiched between the first and second gate regions; an insulated gate transistor is essentially formed between the auxiliary cathode region and the cathode region by the second gate region and the control gate electrode formed all over the second gate region but isolated therefrom by the insulation layer interposed therebetween; electrons injected from the cathode region are stored in the auxiliary cathode region; and a potential barrier that is controlled by the static induction effect is formed in the high-resistivity layer adjoining the auxiliary cathode region by depletion layers spreading from the first and second gate regions.

In a further aspect of the present invention, the control gate electrode is extended over the high-resistivity layer surrounded by the first and second gate regions and to a point on the first gate, with an insulating layer interposed therebetween, and a control gate transistor is essentially formed between the first and second gate regions.

In a further aspect of the present invention, the potential of the second gate region is controllable by the potential of the first gate region, and the second gate region is also electrically shorted to the cathode region via the cathode electrode.

In a further aspect of the present invention, the first gate region is formed larger than the second gate region including the cathode region.

In a further aspect of the present invention, the first gate retion has a higher impurity concentration than does the second gate region.

In a further aspect of the present invention, the first gate region includes a medium or low impurity concentration diffused region of the same conductivity type as the first gate region and formed deeper than the second gate region and a high impurity concentration diffused region formed in the medium or low impurity concentration diffused region.

In a further aspect of the present invention, the first gate region is formed deeper and wider than the second gate region.

In a further aspect of the present invention, the first and second gate regions are each formed as a planar structure.

In a further aspect of the present invention, one or both of the first and second gate regions are formed as buried gate structures.

In a further aspect of the present invention, one or both of the first and second gate regions are formed as recessed structures.

In a still further aspect of the present invention, the cathode region, the anode region and the first and second gate regions each have a lateral structure formed near the same main wafer surface.

DESCRIPTION OF THE PREFERRED EMBODIMENTS

Figure 1:
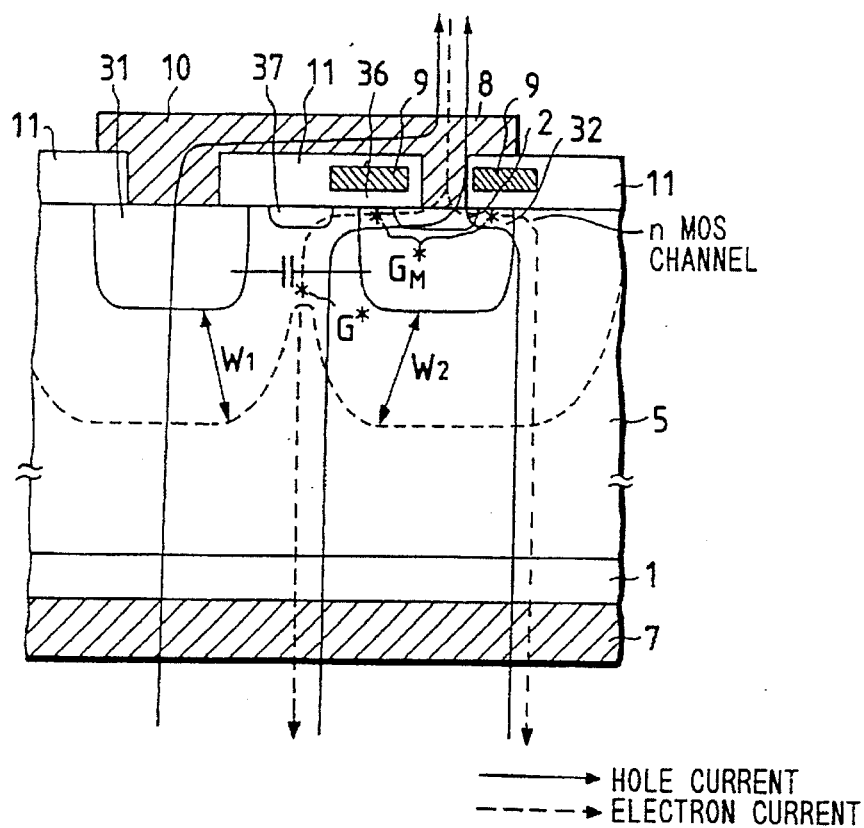
FIG. 1 is a schematic diagram for explaining the principle of operation of an insulated gate static induction thyristor with a split gate type shorted cathode structure according to the present invention.

FIG. 1 schematically illustrates, in section, the insulated gate static induction thyristor with a split gate type shorted cathode structure according to the present invention, for explaining its principle of operation. In FIG. 1, reference numeral 1 denoteds an anode region, 2 a cathode region, 31 a first gate region that is called a cathode short-circuit gate or shielding gate, 32 a second gate region including the cathode region 2, 9 a region called a control gate electrode or control gate electrode formed on the second gate region 32 with a gate oxide film 36 interposed therebetween, 5 a high-resistivity layer, 7 an anode electrode, 8 a cathode electrode, 10 a cathode short-circuit electrode, and 11 an oxide ($SiO_2$) film. The cathode short-circuit electrode 10 is an electrode of the cathode short-circuit gate (or shielding gate) 31, and in practice, it is shorted to the cathode electrode 8. Reference numeral 37 denotes an $n^+$-type auxiliary cathode region. Basically, only the $n^+$-type cathode region 2 is needed and the auxiliary cathode region 37 is unnecessary. The operation of the split gate type structure can be regarded as parallel operations of two thyristors and this can be made clear by showing the auxiliary cathode region 37. The auxiliary cathode region 37 can also be regarded as a source/draing region of a MOSFET. In operation, electrons injected from the cathode region 2 into the high-resistibity layer 5 at the side opposite from the anode region 1 are stored in the $n^+$-type auxiliary cathode region 37; hence, the auxiliary cathode region 37 can be regarded as if it is an actual cathode region. That is, the $n^+$-type auxiliary cathode region 37 is included in the second gate region 32, but it can be considered that when an equivalent MOSFET is turned ON by the action of the MOS gate 9, a uniform cathode region is extended to the auxiliary cathode region 37. Assuming that such an auxiliary cathode region (37) is formed, the subsequent conducting state can be considered as the same as in the case of a static induction thyristor with a pn junction gate. The MOS gate 9 is to provide complete isolation between the first gate (or short-circuit gate) region 31 and the control gate electrode 9; this cannot be implemented by the conventional split gate structure with pn junction gates.

Figure 2:
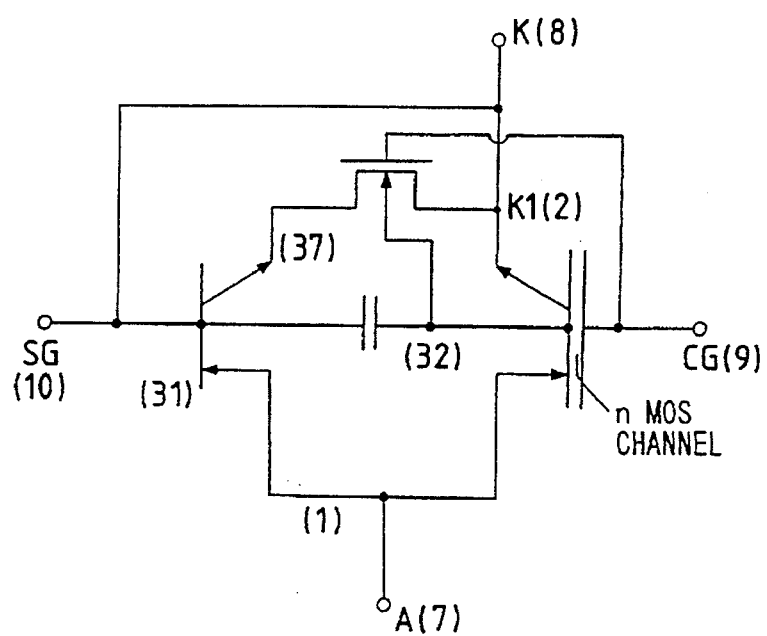
FIG. 2 is a schematic circuit representation of the insulated gate static induction thyristor according to the present invention.

FIG. 2 is a schematic circuit representation of the insulated gate static induction thyristor depicted in FIG. 1. The pn junction static induction thyristor has its gate (SG, 10) connected to the cathode region (2), whereas the conduction of the insulated gate static induction thyristor is controlled by the control gate (CG9) (MOS). With the provision of the MOS gate 9, a MOSFET of a lateral structure [$n^+(2)p(32)n^-(5)$] is formed at either side of the surface portion of the second gate region 32. Taking the auxiliary cathode region 37 into consideration, it will be seen that a MOSFET of a lateral structure [$n^+(2)(32)n^-(5)n^+(37)$] is formed. The $n^+$-type auxiliary cathode region 37 can be regarded as a cathode region of a pn junction gate static induction thyristor that is controlled by the first gate region (31). Moreover, since the region of the high-resistivity layer 5 that is surrounded by the first gate region 31 and the second gate region 32 is virtually depleted, the both gate regions can be considered to be capacitively coupled.

Figure 26:
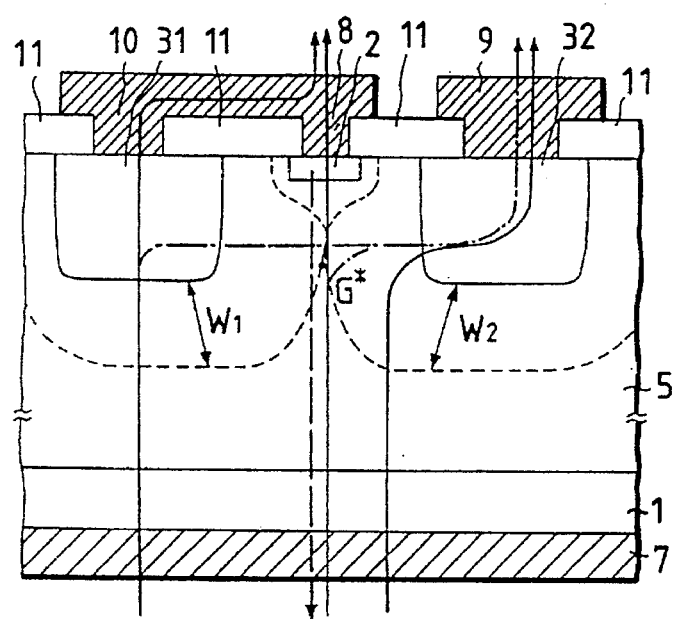
FIG. 26 is a schematic diagram for explaining the principle of operation of a conventional static induction thyristor with a split gate type shorted cathode structure.
Figure 27:
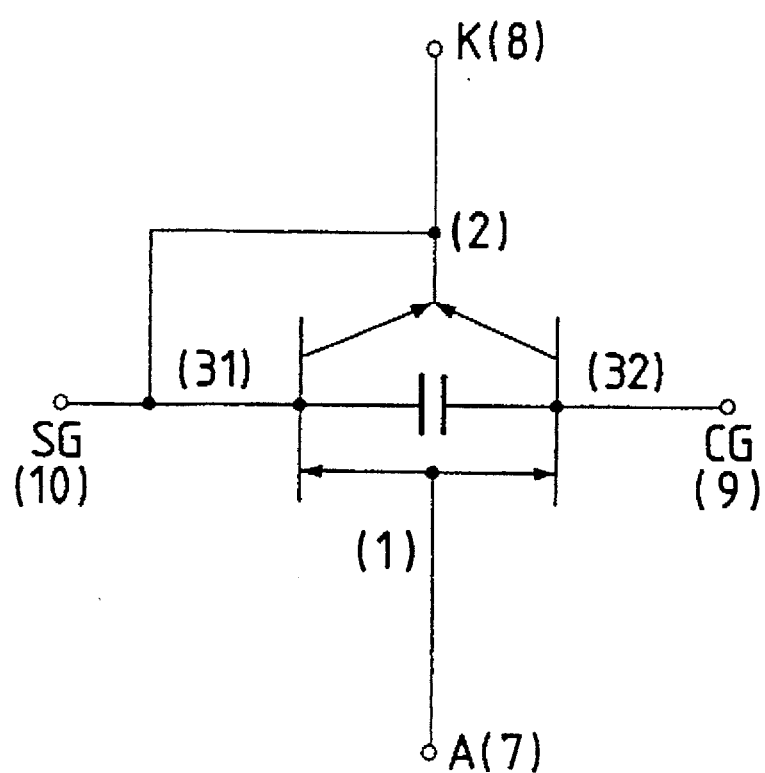
FIG. 27 is a shcematic circuit representation of the conventional static induction thyristor depicted in FIG. 26.

The present invention does not use the second gate itself as the control gate but instead employs an insulated gate structure in which a control gate electrode is formed all over the second gate region 32 with an insulating layer interposed therebetween. In FIG. 1, reference character $W_1$ indicates the width of the depletion layer spreading around the first gate region 31 and $W_2$ the width of the depletion layer spreading around the second gate region 31. As will be seen from FIG. 1, the high-resistivity layer 5 beween the first and second gate regions 31 and 32 is virtually depleted and the depletion layers spreading into the high-resistivity layer 5 from the first and second gate regions 31 and 32, respectively, overlap each other. In the case where the auxiliary cathode region 37 is not taken into account, however, the top of a potential barrier that is called an intrinsic gate point (the point G*), such as shown in FIG. 1 or 26, does not exist. The reason for this is that no potential barrier is formed when there is no $n^+$-type cathode region in that region of the high-resistivity layer 5 which is surrounded by the first and second gate regions 31 and 32. If the auxiliary cathode region 37 is not taken into account, the potential barrier will appear in the second gate region 32 in the insulated gate static induction thyristor according to the present invention. It is considered that the potential barrier against electrons in the cathode region 2 is present in the channel region by an inversion layer near the MOS interface right under the insulated gate electrode 9 or in a deep channel region. The point identified by $G^*_M$ in FIG. 1 is an intrinsic gate point in the MOS control portion.

In the case where the auxiliary cathode region 37 is formed in the high-resistivity layer 5 between the first and second gate regions 31 and 32, it is considered that the intrinsic gate point G* exsists in the vicinity of the region where the depletion layers ($W_1$ and $W_2$) overlap between the first and second gate regions 31 and 32 as in the case of FIG. 1 or 26. In this case, the point $G^*_M$ near the MOS gate interface corresponds to the point $G^*_M$ in the equivalent MOSFET and the point G* corresponds to the point G* in an equivalent junction type statuc induction thyristor. At any rate, it is evident that the insulated gate static induction thyristor with the split gate type shorted cathode structure according to the present invention operates by controlling the potential barrier height near the point $G^*_M$ or G* through utilization of the static induction effect. Where the auxiliary cathode region 37 is formed equivalently, it is desirable that the point G* be close to the MOS gate electrode 9, since the injection of electrons from the auxiliary cathode region 37 is controlled by controlling the potential barrier height at the point G*. This requirement could be met by (1) forming the first and second gate regions 31 and 32 shallow, (2) forming the high resistance layer 5 narrow between the both gate regions 31 and 32, or (3) extending the MOS gate electrode 9 to the vicinity of the first gate region 31 over the point G*.

There are cases where the auxiliary cathode region 37 is positively formed and where it is provisionally formed by electrons injected from the cathode region 2, and it is evident that the injection of electrons is controlled in accordance with the height of the potential barrier at the poing G* in either case. To improve the performance of the equivalent MOSFET between the structures [$n^+(2)p(32)n^-(5)$] and [$n^+(2)p(32)n^-(5)n^+(37)$], it is necessary to shorten the channel. In other words, a high-speed response could be achieved by reducing the channel length of the p-type region (32). Furthermore, the current capacity could be determined by securing a certain channel width. In the case of further enhancing the performance, it is a matter of course that there may also be formed a MOSSIT which permits exponential control of the drain-to-source current with respect to the drain-to-source voltage as well as the gate voltage.

By applying a positive voltage to the control gate electrode 9 formed above the second gate region 32, a conducting channel is formed in an MIS gate interface in the second gate region 32 or a deep channel is formed in the second gate region 32, while at the same time the height of the potential barrier at the point $G^*_M$ is reduced, starting the injection of electrons from the cathode region 2. Holes are also injected from the second gate region 32 as a displacement current from the insulated gate, but the amount of holes injected is far smaller than the amount of holes that are injected from the anode region 1 afterward. In addition, the quantity of holes injected from the second gate region 32 is so smaller than in the case of using a common pn junction that gate the minority carrier storage effect by the gate is slight—this is implemented by the use of the split gate structure and the insulated gate. The hole current from the second gate region 32 to the first gate region 31 in mostly a displacement current by capacitive coupling and an essential conducting current is very small. By the positive voltage applied to the insulated control gate electrode 9 the potential of the second gate region 32 also goes positive in a capacitive-coupling manner, with the result that the potentials at the points $G^*$ and $G^*_M$ drop and the width $W_2$ of the depletion layer also decreases. At the same time as the injection of electrons from the cathode region 2 starts, a conduction channel for electrons is formed between the first and second gate regions 31 and 32. Consequently, electrons in the cathode region 2 are injected into the high-resistivity layer 5 and thence to the anode side. As will be seen from the above, there are two electron current paths: an nMOSFET channel and a channel defined by the nMOSFET and the junction type SIT. As the electrons injected from the cathode region 2 are stored near the interface between the anode region 1 and the high-resistivity layer 5 and the barrier height against holes in the anode region 1 decreases accordingly, the injection of holes from the anode region 1 begins. The hole current from the anode region 1 mostly flows into the first gate region 31 electrically shorted to the cathode region 2, the remainder flowing into the second gate region 32. The rates at which the hole current flows into the first and second gate regions 31 and 32 are dependent upon the shape of the potential distribution based on the potential difference between the both gate regions, their area ratio, or their geometrical depths or similar configurational factors. When the second gate region 32 is held positive relateve to the first gate region 31, it is anticipated that more holes will flow into the first gate region 31 than those flowing into the second gate region 32. The reason for this is that the first gate region 31 is lower in its potential barrier against holes than the second gate region 32 and is in a state in which it readily stores the holes. On the other hand, the second gate region 32 covered with the control gate electrode 2 formed thereabove is readily charged by a relatively small hole current flowing thereinto since its substantial electrostatic capacitance is substantially small. In consequence, the potentials at the points $G^*$ and $G^*_M$ further drop, causing further injection of electrons, while at the same time further supplying holes from the anode electrode 7 via the anode region 1. As the result of this, the thyristor enters its latch-up state. In the latch-up state the potentials at the point $G^*$ and $G^*_M$ are low, allowing the formation of a channel for electrons between the anode region and the cathode region 2.

Thus, when the thyristor is in the ON state, electrons from the cathode region 2 flow into the anode region 1 and then to the anode electrode 7, whereas holes from the anode side flow mainly into the first gate region 31 (i.e. the gate shorted to the cathode) and into the cathode region 2 through the second gate region 32. In FIG. 1 there are schematically indicated by arrrows how the electron current and the hole current flow when the thyristor is in the ON state. Incidentally, the insulated gate static induction thyristor with a split gate type shorted cathode structure according to the present incention has two modes for its ON state: the above-said latch-up mode and a non-latch-up mode. In the latch-up mode, the main thyristor is held ON even if the positive voltage applied to the MOS gate electrode 9 at the time of its turn-ON opereation is cut off and the main thyristor returns to a zero-bias state. This is what is called a thyristor mode. In the non-latch-up mode, the main thyristor is not held ON when the above-mentioned positive voltage is cut off and the thyristor returns to the zero-bias state. This is what is called a transistor mode. Hence, in the non-latch-up mode, it is necessary to keep on applying the positive voltage to the MOS gate electrode 9 to maintain the main thyristor in the ON state. In the case of a structure wherein the second gate region 32 is kept floating and is not electrically shorted to the cathode region 2 (FIGS. 1, 3, 5, 10, 12, 13, 15, 16, 17, 18, 19, 20, 21, 22 and 24, for instance), the main thyristor mostly operates in the latch-up mode. In the case of a structure wherein the second gate region 32 is electrically shorted to the cathode region 2 (FIGS. 4, 6, 7, 8, 9, 11 and 23, for instance), the main thyristor mostly operates in the non-latch-up mode. It is a mater of course that the application of the positive voltage to the MOS gate electrode 9 may be continued so as to ensure that the turn-ON state of the main thyristor is held in the latch-up mode as well.

Next, a description will be given of the turn-OFF operation of the thyristor. Applying negative voltage pulses to the MOS gate electrode 9 above the second gate electrode 32, the channel region in the MOS interface or the deep channel region is cut off; at the same time the width $W_2$ of the depletion layer spreading into the high-resistivity layer 5 from the second gate region 32 increases and the heights of the potential barriers at the points $G^*$ and $G^*_M$ increase, cutting off the channel between the first and second gate regions 31 and 32 as well. As a result, the hole current that has flowed into the cathode region 2 and the first gate region 31 from the anode region 1 so far partly flows into the second gate region 32 being negatively biased. In this instance, however, the quantity of hole current that flows into the second gate region 32, by-passing the first gate region 1, is far smaller than the total quantity of hole current flowing into the first gate (i.e. short-circuit gate) region 31. Upon application of the negative voltage pulses to the MOS control gate electrode 9, the potential barrier heights near the points $G^*$ and $G^*_M$ increase instantaneously, stopping the injection of electrons from the cathode region 2. In this state, the hole current from the anode side mostly flows into the first gate region 31 but the quantity of this hole current gradually decreases. The hole current flowing into the cathode region 2 also gradually decreases by the effect of the potential of the MOS gate electrode 9 formed above the second gate region 32. Thus, the hole current that the control gate electrode 9 has to control may be far smaller than in the case of employing the common gate, since the entire hole current is shared between the first and second gate regions 31 and 32 through utilization of the split gate structure. Moreover, since the split gate structure is employed which includes the insulated gate structure, the quantity of holes that are injected from the gate is so small that the minority carrier storage effect can also be substantially lessened.

Next, a description will be given of the operation of the insulated gate static induction thyristor with a split gate type shorted cathode structure according to the present invention. The first and second gate regions 31 and 32 are separated by the high-resistivity layer 5, but since the depletion layers spreading from the first and second gate regions 31 and 32 overlap each other, the potential of the second gate region 32 is controllable by the potential of the first gate region 31 in terms of static induction. The second gate region 32 may be electrically shorted to the cathode region 2 or held electrically floating. When it is held floating, holes injected from the anode side are partly stored in the second gate region 32, effectively promoting the injection of electrons from the cathode region 2. When the cathode region 2 and the second gate region 32 are electrically shorted, the holes stored in the second gate region 32 are absorbed by the cathode short-circuit electrode 10. Thus, the injection of electrons from the cathode region 2 is controlled mainly by the MOS gate electrode 9, and hence the hole storage effect by the second gate region 32 is practically neglectable.

The turn-ON operation of the insulated gate static induction thyristor according to the present invention will be supplemented below. The turn-ON operation that can be applied not only in the case where the auxiliary cathode region 37 is taken into account in the basic structure of FIG. 1 but also in the case where it is not taken into account is to drive the second gate region 32 positive in a pulsed fashion by the positive voltage that is applied to the MOS gate electrode 9. In the drive mode by such a MOS capacitor, the second gate region 32 is driven positive in a pulsed fashion, biasing the p(32)n⁻(5) junction in the forward direction. Even if the first and second gate regions 31 and 32 are preset to be normally OFF therebetween, a channel is formed between the cathode and the anode by the positive bias driving of the second gate region 32. As the result of this, electrons that flow from the cathode region 2 into the high-resistivity layer 5 through the MOS gate interface or deep channel readily go beyond the lowered potential barrier and reach the anode side. To ensure the execution of such turn-ON drive mode by the MOS capacitor coupling, it is important to set the MOS capacitance large. That is, the MOS capacitance between the control gate electrode 9 and the second gate region 32 is set large—this can be done by decreasing the thickness of the gate oxide film 36, by increasing the effective area of the MOS capacitor, or by using a ferromagnetic material for the gate oxide film 9, for instance. In the above-said operation mode, the second gate region 32 may be electrically shorted to the cathode region 2 or may also be held floating. As will be seen from the above, the turn-ON operation of this insulated gate type static induction thyristor includes the electron injection mode conducting the MOS interface channel in addition to the MOS capacitor drive mode. That is, it is better or preferable to positively utilize the injection of electrons through the nMOSFET having a structure [n⁺(2)p(32)n⁻(5)].

When the application of the turn-ON gate pulses is stopped, the second gate region 32 is charged substantially negative. The reason for this that negative charges are stored in the second gate region 32 corresponding to the quantity of holes injected therefrom. Since the second gate region 32 is thus negatively biased, the injection of electrons from the cathode region 2 is prevented. In the latch-up mode, however, an overwhelmingly large quantity of hole current flows into the second gate region 32 as well, the main thyristor remains in the ON state. In the non-latch-up mode, the main thyristor is turned OFF. To ensure turning-OFF of the main thyristor, negative pulses are applied to the control electrode 9.

To stop the hole injection from the anode region 1 after the electron injection from the cathode region 2 has also been stopped by the restoration of the potential barrier at the point $G^*_M$ to its original height by the application of the negative bias pulse to the control gate electrode 9, it is preferable to extinguish the electrons stored near the anode side through structural or lifetime control in combination with the use of a structure which stops the hole injection from the anode region 1 (an anode short, double gate structure, for instance) or hole lifetime control.

Since the first gate region 31 is always electrically shorted to the cathode region 2, holes near the first gate region 31 are liable to be absorbed by it. Hence, the hole storage effect near the cathode region 2 and the first gate region 31 does not matter. Furthermore, since there is no potential difference between the first gate region 31 and the cathode region 2, the operation of a parasitic thyristor of the structure [p(31)n⁻(5)p(32)n⁺(2)] defined by the first gate region 31 and the cathode region 2 is suppressed. The capacitances that greatly contribute to the switching operation are the MOS gate capacitance, the capacitance between the second gate region 32 and the cathode region 2 and the capacitance between the second gate region 32 and the high-resistivity layer 5. On the other hand, the width $W_1$ of the depletion layer spreading from the first gate region 31 toward the anode region 1 undergoes a substantial change with the voltage condition of the latter. This change causes a substantial change in the capacitance between the first gate region 31 and the anode region 1 as well, but it is desirable to prevent this capacitance variation from exerting an influence on the anode side.

In the insulated gate static induction thyristor with a shorted cathode structure according to the present invention, the anod-to-cathode current that is controllable through the control gate 9 formed above the second gate regioon 32 can be increased substantially through utilization of the merit of the first gate (or short-circuit gate) region 31 which acts as a region for absorbing holes. By this, the maximum controllable current/voltage durability can be enhanced. Besides, the quantity of holes that are injected from the MOS control gate electrode 9 is essentially very small, and the quantity of carriers (holes) stored near the cathode region 2 during the ON period is also made smaller by the provision of the short-circuit gate 31 than in the case of employing the common gate structure. Hence, the quantity of holes to be absorbed by the control gate during the turn-OFF period is so small that the turn-OFF capability or performance can be improved. It is also expected, as another advantage of the split gate structure, that the turn-ON switching capability of performance is improved by the reduction of the gate input capacitance owing to the introduction of the MOS gate structure. Further, since the short-circuit gate 31 and the control gate electrode 9 can be isolated completely from each other, current control by the control gate 9 can be effected completely independently of the short-circuit gate 31.

Figure 3:
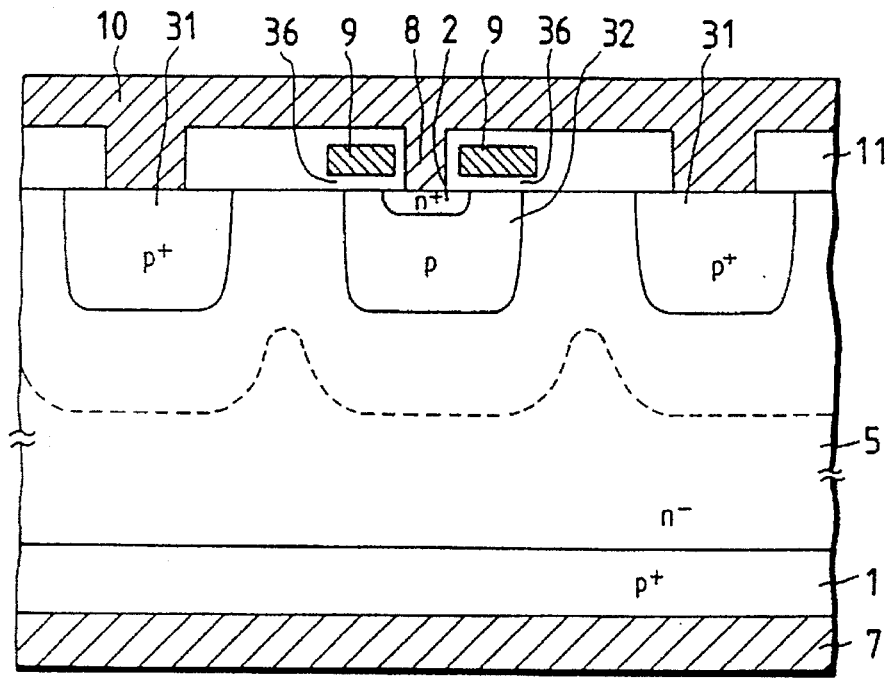
FIG. 3 is a sectional view schematically illustrating a first embodiment of the insulated gate static induction thyristor according to the present invention.
Figure 4:
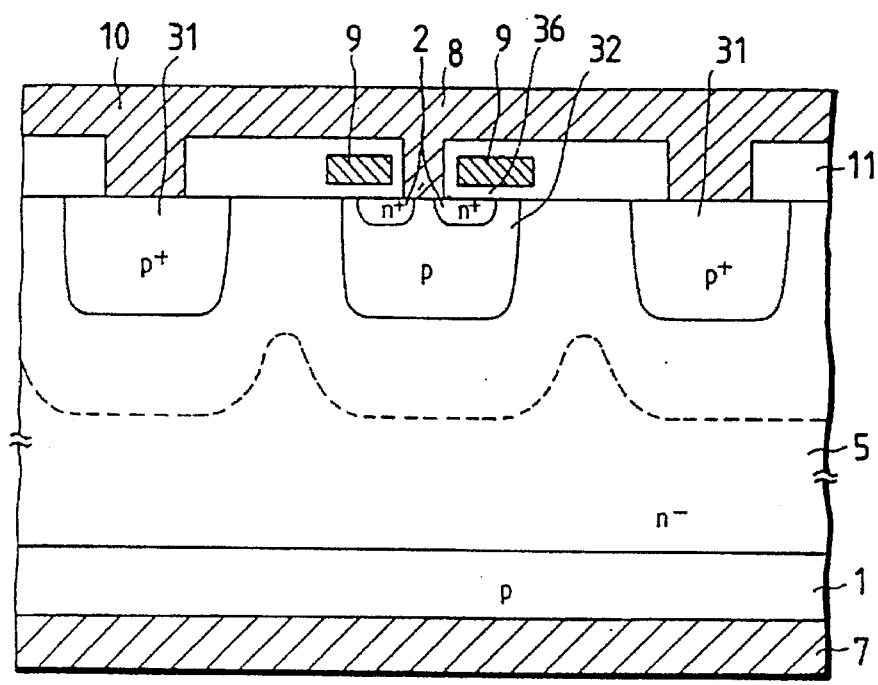
FIG. 4 is a sectional view similarly illustrating a second embodiment of the present invention.

The structure shown in FIG. 1 is a basic structure of the present invention, but it can be used as a planar gate structure (Embodiment 1) by forming the first and second gate regions 31 and 32 as pn junction gates and by forming the anode region 1 as a p⁺-type region. FIG. 3 schematically illustrates, in section, the insulated gate static induction thyristor with a split gate shorted cathode structure according to the first embodiment of the present invention. In Embodiment 1 the auxiliary cathode region 37 is not positively formed. The cathode region 2 is formed in the second gate region 32. The cathode region 2 has a stripe or dot pattern. The first and second gate regions 31 and 32 are identical in shape and formed, as a planar gate structure, by the diffusion of boron (B) or the like or by ion implantation. In the FIG. 3 embodiment, the control gate electrode 9 is formed above the second gate region 32 with the insulating layer 36 interposed therebetween; therefore, the p-type region 32 in the MOS gate interface between the cathode region 2 and the high-resistivity layer 5 serves as a channel region. In the FIG. 3 embodiment, the first gate region 31 serving as the short-circuit gate is disposed at either side of the second gate region 32 to increase the hole current absorption efficiency. Since the triggering sensitivity of the insulated gate type static induction thyristor (the current gain at the time of turn-ON operation) is so high that a required quantity of hole current can be drawn from the anode side by a very small amount of electron current. Hence, the turn-ON capability or performance can sufficiently be secured with no appreciable influence on the turn-ON period. The turn-OFF operation has already described. In the example of FIG. 3 the p-type region 32 is not electrically shorted to the cathode region 2.

In FIG. 3 the anode region 1 is shown to be formed as a flat and uniform structure in the interests of clarity. It is a matter of course to employ, for the anode side, a shorted anode structure, an SI short structure (Japanese pat. Laid-Open No. 93169/89), a structure with a buffer, a structure with an SI buffer (Japanese Pat. Appln. No. 114140/92), a structure with a drift buffer (Japanese Pat. Appln. No. 144887/92), or a double gate structure using a planar or buried structure.

[Embodiment 2]

FIG. 2 schematically illustrates, in section, the insulated gate static induction thyristor with a split gate shorted cathode structure according to a second embodiment of the present invention. The FIG. 4 embodiment has its feature in that the first and second gate regions 31 and 32 have different-impurity concentrations so as to separate their functions and in that the second gare region 32 is electrically shorted to the cathode region 2. That is, the first gate (shielding gate) region 31, which functions as a cathode short-circuit gate, is formed as a $p^{++}$ region whose impurity concentration differs from that of the second gate (control gate) region 32 formed as a p-type region. The $n^+$ cathode region 2 and the p-type second gate region 32 are electrically interconnected via the cathode electrode 8. The reason why the impurity concentration of the first gate region 31 is set high is that the diffusion potential between the first gate region 31 and the high-resistivity layer 5 can be made higher than the diffusion potential between the second gate region 32 and the high-resistivity layer 5, with the result that minority carriers (holes) near the cathode surface are more absorbed by the first gate region 31. The high impurity concentration of the first gate region 31 facilitates the flowing of the hole current from the anode region 1 into the first gate region 31, heightening the cathode shorting effect. The electrical shorting of the second gate region 32 to the cathode region 2 allows efficient absorption of holes by the second gate region 32. Under the action of the MOS control gate electrode 9, the second gate region 32 acts as a channel that controls the electron injection from the cathode region 2, and during the ON and OFF periods it conducts only a smaller quantity of hole current than does the first gate region 31. Besides, since the control gate electrode 9 has a MOS structure, the thyristor can be turned ON and OFF with a very small quantity of current—this lightens the burden on the second gate region 32. As is the case with Embodiment 1, the shorted anode structure, the buffer structure or the double gate structure can be used for the anode side.

[Embodiment 3]

Figure 5:
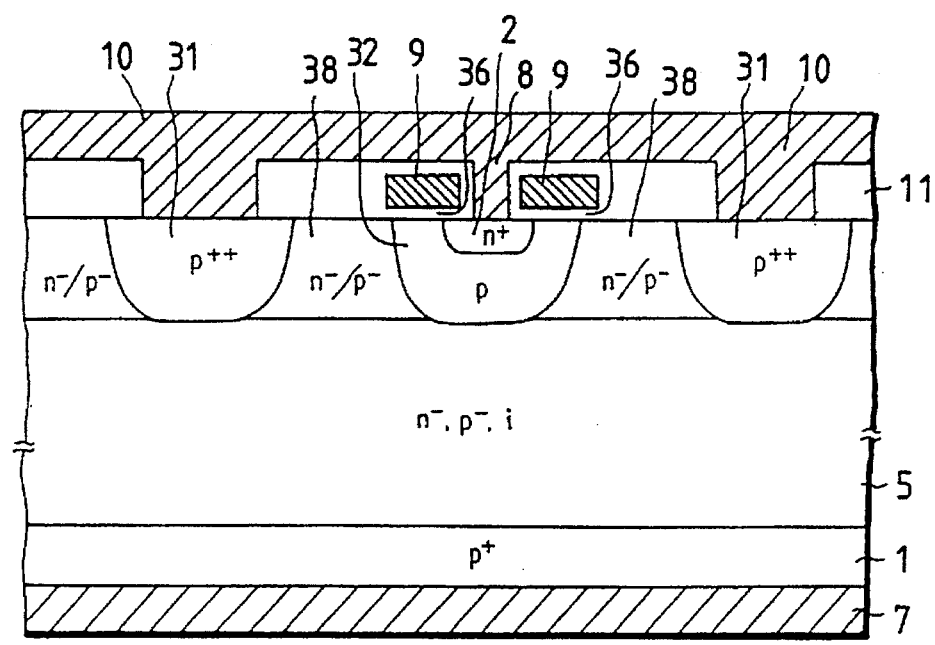
FIG. 5 is a sectional view illustrating a third embodiment of the present invention.

FIG. 5 schematically illustrates, in section, the insulated gate static induction thyristor with a split gate type shorted cathode structure according to a third embodiment of the present invention. In this embodiment the cathode region 2 is formed in the second gate region 32 and the latter is not electrically shorted to the cathode region 2. This embodiment is common to Embodiment 2 (FIG. 4) in that the first and second gate regions 31 and 32 have different impurity concentrations, with the former formed as a $p^{++}$-type region and the latter as a p-type region. Because of the difference between the impurity concentrations of the both gate regions, the minority carriers or holes near the cathode surface can readily be absorbed by the first gate region 31. The structural feature of this embodiment resides in that the first and second gate regions 31 and 32 are both formed shallow and a high-resistivity region 38 ($n^-/p^-$) is formed by epitaxial growth or the like in that region of the high-resistivity layer 5 which is surrounded by the first and second gate regions 31 and 32, thereby tightening the capacitive coupling between the both gate regions. With such a construction, even if the second gate region 32 is held electrically floating, its potential can easily be controlled by the potential of the first gate region 31. As referred to above, the shorted anode structure, the buffer structure and so forth can be employed for the anode side, in addition to the structure shown in FIG. 5.

[Embodiment 4]

Figure 6:
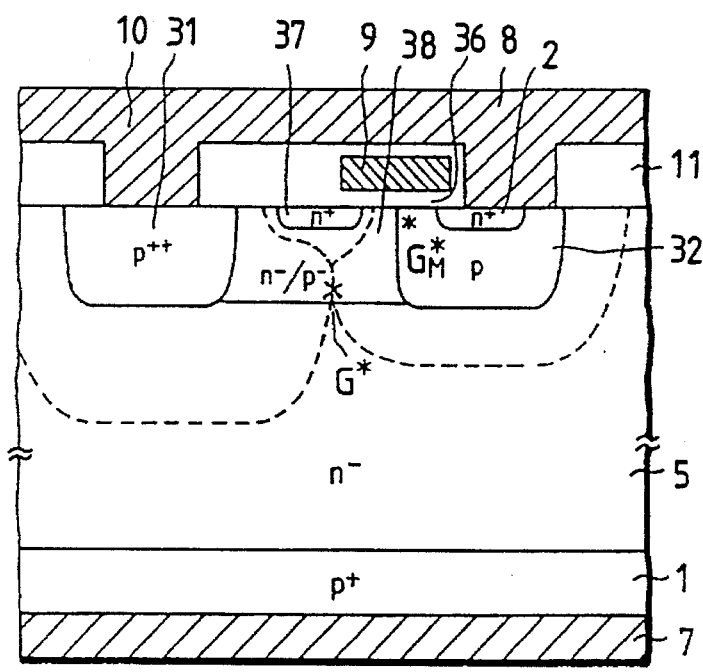
FIG. 6 is a sectional view illustrating a fourth embodiment of the present invention.

FIG. 6 schematically illustrates, in section, the insulated gate static induction thyristor with a split gate shorted cathode structure according to a fourth embodiment of the present invention. In this embodiment the first gate region 31 is formed as a $p^{++}$-type region and the second gate region 32 is formed as a p-type region and the latter is used as a short-circuit gate shorted to the cathode region 2 to enhance the function of the first gate region 31. This embodiment has a structural feature in that the auxiliary cathode region 37, which serves as a source/drain region of a MOSFET or MOSSIT, is interposed between the first and second gate regions 31 and 32. The control gate electrode 9 is formed above the second gate region 32 with the gate oxide film 36 deposited therebetween. Reference numeral 38 denotes a high-resistivity layer ($n^-/p^-$) different from the high-resistivity layer 5 and formed as part of an epitaxial growth layer between the first and second gate regions 31 and 32. The reason for the provision of such a high-resistivity layer 38 is to enhance the controllability of the second gate region 32 by the first gate region 31. The high-resistivity layer 38 need not be provided when a sufficient degree of capacitive coupling is obtainable with the high-resistivity layer 5 alone. An important point of this embodiment in terms of operation is that the auxiliary cathode region 37 operates as if a thyristor of a planar structure having the first and second gate regions 31 and 32 formed as pn junction gates. The first and second gate regions 31 and 32 are capacitively coupled and electrically shorted to the cathode region 2, and hence they effectively absorb holes. On the other hand, electrons injected from the cathode region 2 and having passed through the channel region in the MOS interface are stored in the auxiliary cathode region 37 acting as the source/drain region of the MOSFET. As the pontential barrier at the point G* is lowered by the capacitive coupling of the gate voltage applied to the MOS gate electrode 9, electrons are injected from the cathode (2, 37) into the high resistance layer 5, causing a hole injection from the anode region 1 and putting the thyristor into the latch-up state. Incidentally, it is a matter of course that at the time of turning ON the thyristor, an n-MOS channel that extends down from the n$^+$-type cathode region 2, past the p-type second gate region 32 and into the n$^-$-type high-resistivity layer 5 may be formed, in addition to the above-mentioned MOS capacitor driving. When the thyristor is in the ON state, the n$^+$-type cathode region 2 and the n$^+$-type auxiliary cathode region 37 are made substantially a common region by continuing the application of the positive voltage to the MOS gate electrode 9. The main thyristor can be turned OFF simply by applying a negative voltage to the MOS gate electrode 9. Upon application of the negative voltage to the electrode 9, the MOSFET is stopped from conduction and the supply of electrons from the cathode region 2 stops. At the same time, the potential at the point G* rises owing to the capacitive coupling of the negative-going voltage pulses applied to the MOS gate electrode 9. Hence, the electron current in the main thyristor stops. The hole current that has been absorbed by the cathode electrode (8, 10) so far gradually decreases after cutting-off of the electron current, resulting in the main thyristor entering the OFF state. To cut off the hole current at high speed, it is necessary to effect carrier lifetime control or employ a shorted anode structure, double gate structure, or similar structure.

[Embodiment 5]

Figure 7:
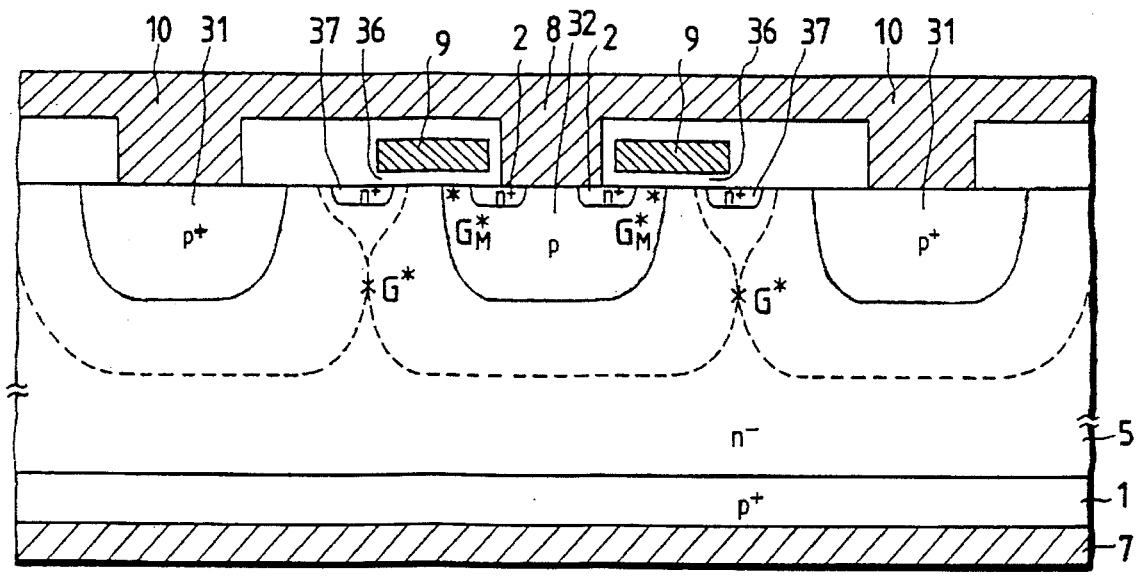
FIG. 7 is a sectional view schematically illustrating a fifth embodiment of the present invention.

FIG. 7 schematically illustrates, in section, the insulated gate static induction thyristor with a split gate type shorted cathode structure according to a fifith embodiment of the present invention. In this embodiment, the first gate region 31 is provided at either side of the second gate region 32 to facilitate absorption of the hole current. Furthermore, the impurity concentration of the first gate region 31 is set higher than the impurity concentration of the second gate region 32 to heighten the minority carrier absorbing effect of the first gate region 31. This embodiment is common to the Embodiment 4 of FIG. 6 in the provision of the auxiliary cathode region 37 between the first and second gate regions 31 and 32. The cathode region 2 and the second gate region 32 are electrically connected via the cathode electrode (10, 8). The operation of this embodiment is the same as described above in connection with Embodiments 1 through 4.

[Embodiment 6]

Figure 8:
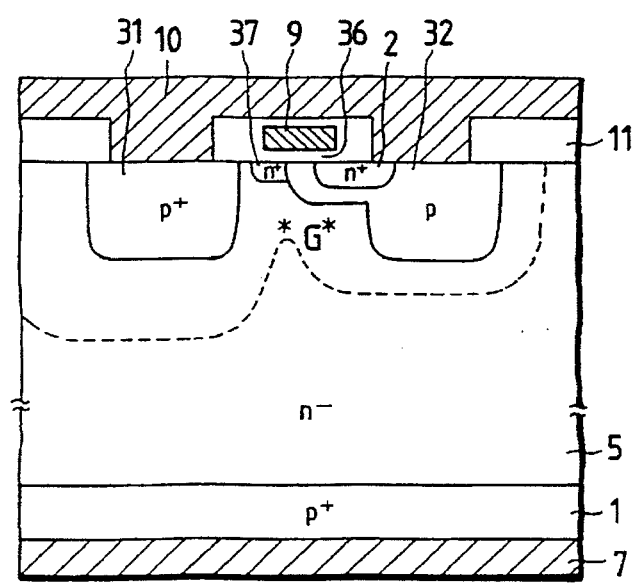
FIG. 8 is a sectional view schematically showing a sixth embodiment of the present invention.

FIG. 8 schematically illustrates, in section, the insulated gate static induction thyristor with a split gate type shorted cathode structure according to a sixth embodiment of the present invention. A structural feature of this embodiment resides in that the MOS gate electrode 9 is disposed above the high-resistivity layer 5 between the first and second gate regions 31 and 32, with the gate oxide film 36 interposed between them. As a result, the cathode region 2 is disposed close to the first gate region 31—this permits reduction of the channel length of the MOSFET. Moreover, the first and second gate regions 31 and 32 are also disposed close to each other, and hence their capacitive coupling is further tightened. The positioning of the MOS gate electrode 9 as shown in FIG. 8 offers an advantage that the height of a potential barrier set up in front of the virtual or imaginary auxiliary cathode region 37 at the point G* can easily be controlled with the voltage that is applied to the MOS gate electrode 9. The auxiliary cathode region 37 need not positively provided, and it may be considered to be formed as the result of the storage of electrons injected from the cathode region 2. Also in this embodiment, the impurity concentration difference is set between the first gate region 31 and the second gate region 32 to heighten the minority carrier absorption effect of the latter.

[Embodiment 7]

Figure 9:
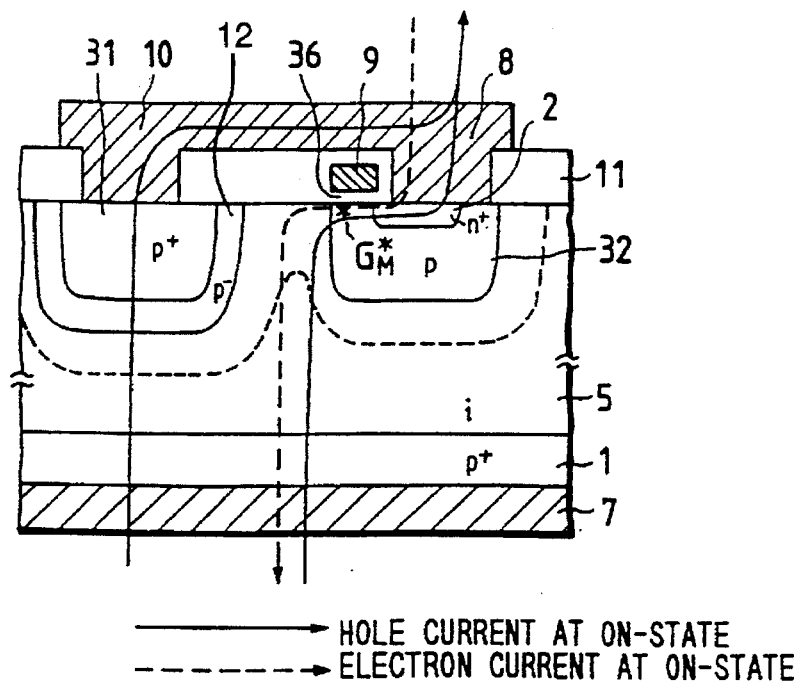
FIG. 9 is a sectional view schematically illustrating a seventh embodiment of the present invention.
Figure 10:
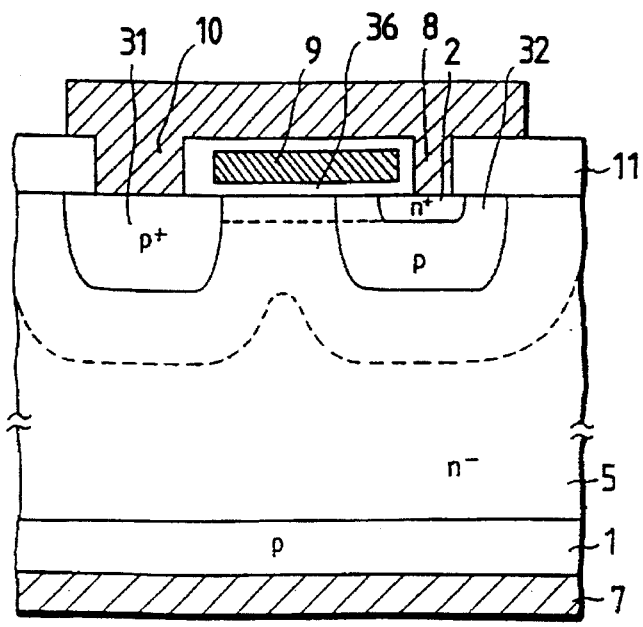
FIG. 10 is a sectional view schematically showing an eighth embodiment of the present invention.

FIG. 9 schematically illustrates, in section, the insulated gate static induction thyristor with a split gate type shorted cathode structure according to a seventh embodiment of the present invention. This embodiment has its feature in that the first gate is surrounded by a low impurity concentration gate region 12 with a view to separating the first gate region 31 from the second gate region 32 in terms of function. With the p$^+$ p$^-$ (31, 12) structure of the first gate region 31, it is possible to form the region 31 deeper than the second gate region 32 and to eneble holes in such a deep and wide region to be absorbed by the first gate region (i.e. the cathode short-circuit gate) 31. The low impurity concentration gate region 12 serves also to alleviate a high intensity electric field that is applied across the first gate region 31 and the high-resistivity layer 5. That is, there is a case where a high voltage is applied across the anode region 1 and the cathode region 2 according to the operating condition of the thyristor, a high voltage is applied across the first gate region 31 shorted to the cathode region 2 and the anode region 1, in which case a high intensity electric field is concentrated on the p$^+$i junction interface of the first gate region 31. The low impurity concentration region (p$^-$) 12 permits relaxation of such a high intensity electric field.

[Embodiment 8]

FIG. 8 schematically illustrates, in section, the insulated gate static induction thyristor with a split gate type shorted cathode structure according to an eighth embodiment of the present invention. This embodiment has its feature in that the MOS gate electrode 9 is extended laterally on the gate oxide film 36 from the cathode region 2 to the first gate region 31. That is, an n-channel MOSFET of a structure [n$^+$(2)p(32)n$^-$(5)] and a p-channel MOSFET of a structure [p(32)n$^-$(5)p$^+$(31)], both including the common gate electrode 9, are equivalently formed in the lateral direction. As mentioned previously, the n-channel MOSFET [n(2)p(32)n$^-$(32)] may be taken into consideration. By applying a positive voltage to the MOS gate electrode 9, the above-mentioned n-channel MOSFET or n-MOS channel is conducted, turning ON the thyristor. By applying a negative voltage to the electrode 9, the n-channel MOSFET or n-MOS channel is cut off and the p-channel MOSFET is conducted. By this, the first and second gate regions 31 and 32 become common to each other. Hence, the second gate region 32 can be made equipotential to the first gate region 31, permitting cutting off the thyristor. Also in this embodiment, it is evident that the short-circuit structure, the buffer structure or the like can be used for the anode region 1.

[Embodiment 9]

Figure 11:
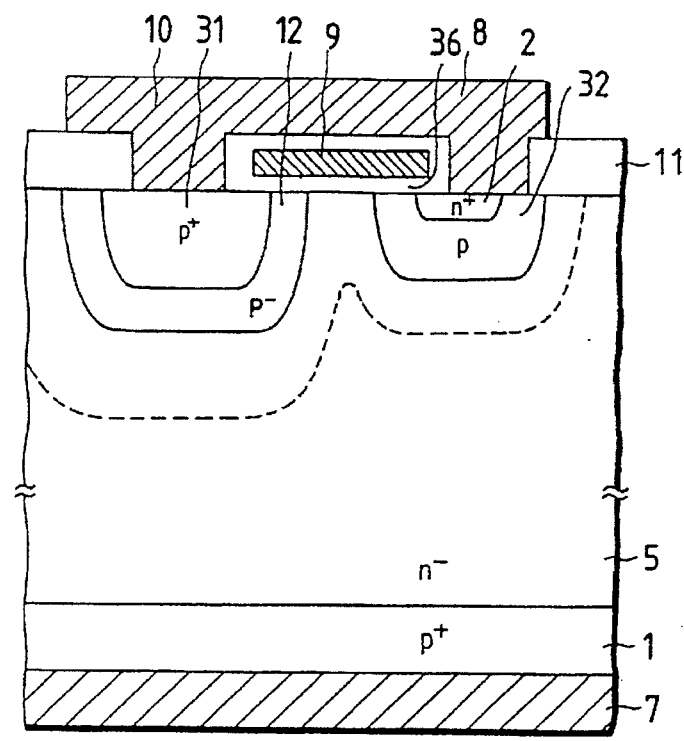
FIG. 11 is a sectional view schematically showing a ninth embodiment of the present invention.

FIG. 11 schematically illustrates, in section, the insulated gate static induction thyristor with a split gate type shorted cathode structure according to a ninth embodiment of the present invention. In this embodiment, the cathode region 2 is formed in the second gate region 32 and the first gate region 31 is formed with an impurity concentration higher than that of the second gate region 32 and is surrounded by the p⁻-type layer 12. In separating the first and second gate regions S1 and 32 in terms of function, it is effective to form the first gate region 31 deep as the p⁺(31)p⁻(12) structure as shown. The MOS gate electrode 9 is extended laterally from the cathode region 2 to the first gate region 31, and such n-channel and p-channel MOSFETs as mentioned above are formed equivalently. Of course, the auxiliary cathode region 37 may also be provided, and the n-MOS channel of the n⁺(2)p(32)n⁻(5) structure may also be formed.

[Embodiment 10]

Figure 12:
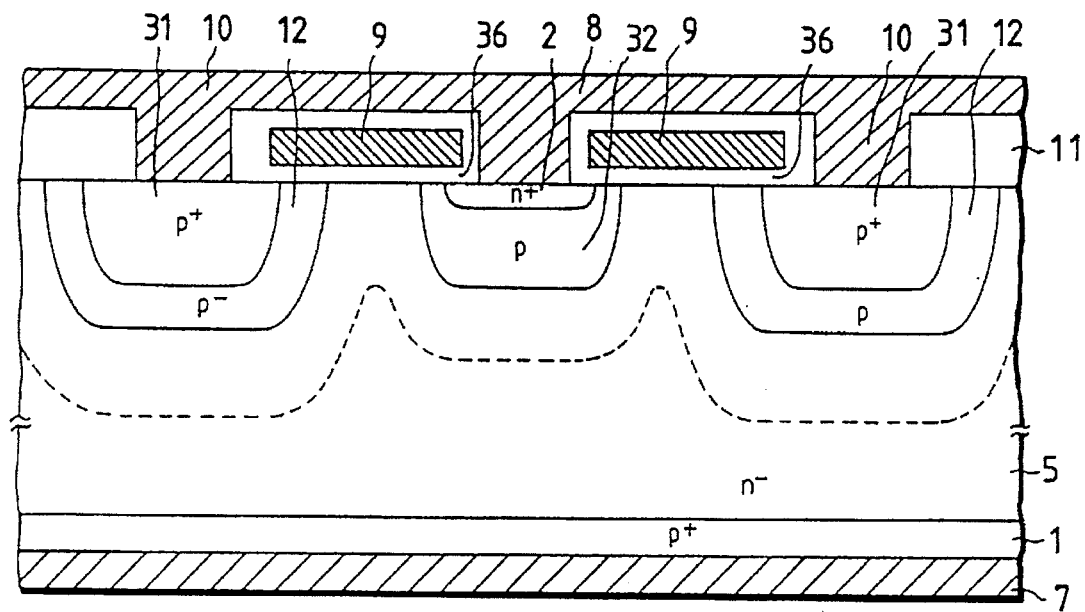
FIG. 12 is a sectional view schematically showing a tenth embodiment of the present invention.

FIG. 12 schematically illustrates, in section, the insulated gate static induction thyristor with a split gate type shorted cathode structure according to tenth embodiment of the present invention. In this embodiment, the cathode region 2 is shorted to the first gate region 31, the short-circuit region (31, 12) is disposed at either side of the second gate region 32, and the p⁻-type layer 12 serving as an electric field alleviating layer is formed thin around the p⁺-type first gate region 31. With the provision of the p⁻-type layer 12, it is possible to reduce the high intensity field resulting from the high voltage that is applied across the anode region 1, the first gate 31 and the cathode region 2. The gate electrode 9 is extended laterally above the regions n⁺(2)p(32)n⁻(5)p⁻(12)p⁺(31), with the gate oxide film 36 interposed between them. The gate electrode 9 is common to the n-channel MOSFET [n⁺(2)p(32)n⁻(5)] and the p-channel MOSFET [p(32)n⁻(5)p⁻(12)p⁺(31)]. The cathode region 2 is not electrically shorted to the second gate region 32. Yet, the amount of holes that are stored in the second gate region 32 can be controlled by the capacitive coupling between the p⁺(32)p⁻(12) region and the p(32) region. In the Off state, in particular, the p-channel MOSFET enters the ON state, making the p⁺(31)p⁻(12) region and the p(32) region equipotential. Incidentally, it is a matter of course that the second gate region 32 may be electrically shorted to the cathode region 2. Moreover, the n-MOS channel [n⁺(2)p(32)n⁻(5)] may also be formed at the side opposite from the anode region1, as mentioned previously.

[Embodiment 11]

Figure 13:
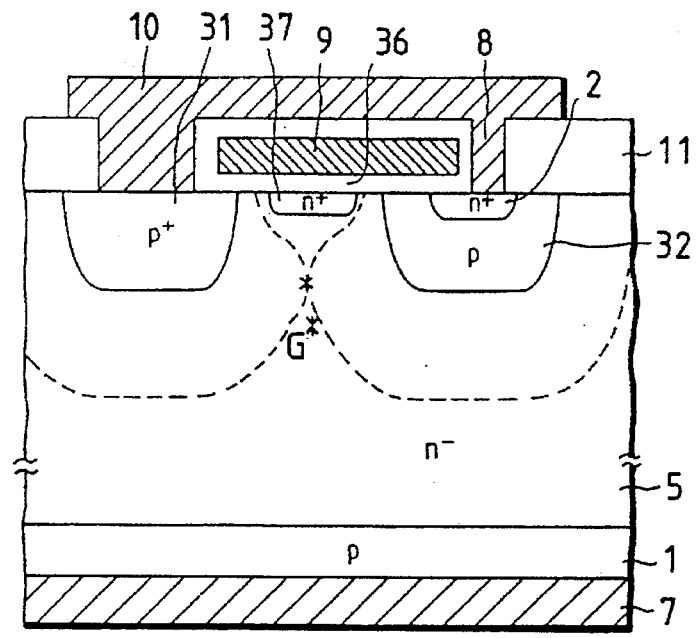
FIG. 13 is a sectional view schematically showing a eleventh embodiment of the present invention.

FIG. 13 schematically illustrates, in section, the insulated gate static induction thyristor with a split gate type shorted cathode structure according to an eleventh embodiment of the present invention. This embodiment is structurally characterized in that the auxiliary cathode region 37 is disposed between the first and second gate regions 31 and 32 and that the MOS gate electrode 9 is extended between the first and second gate regions 31 and 32. It is obvious that n-channel and p-channel MOSFETs are formed laterally by the MOS gate electrode 9. Such an auxiliary cathode region 37 can also be regarded as a cathode region of a planar SI thyristor with an pn junction gate (31, 32). It is preferable, of course, that the n⁺-type region 37 be not formed in the channel of the lateral p-channel MOSFET. That is, the n⁺-type region 37 may be formed in a mesa form. While the cathode region 2 is shown not to be electrically shorted to the second gate region 32, it is needless to say that they may be shorted. In the case where the structure of this embodiment depicted in FIG. 13 is utilized for a multi-channel structure, it is possible to dispose the first gate region 31 at either side of the second gate region 32 to facilitate the absorption of holes. Of course, the n-MOS channel [n⁺(2)p(32)n⁻(5)] may be formed at the time of turning ON the thyristor.

Figure 14:
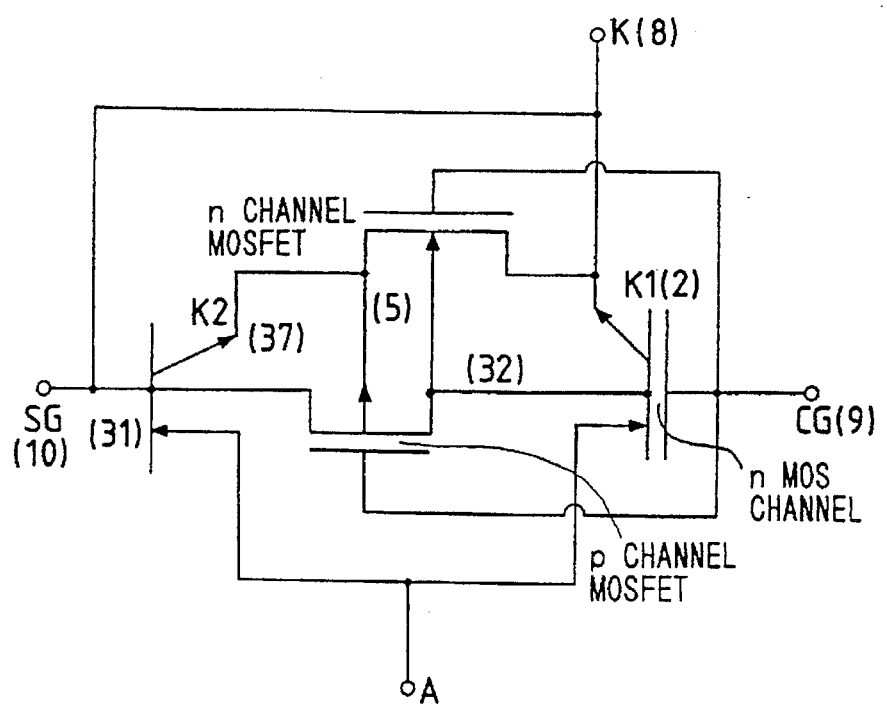
FIG. 14 is a schematic circuit representation of the insulated gate static induction thyristor shown in FIGS. 8 through 11.

FIG. 14 is a schematic circuit representation of the insulated gate static induction thyristor shown in each of FIGS. 10 through 13. Since the structures of Embodiments 8 through 11 include the control gate electrode 9 as a gate electrode common to the n-channel and p-channel MOSFETs, such a circuit representation as shown in FIG. 14 is possible. In FIG. 14, K1 and K2 correspond to the cathode region 2 and the auxiliary cathode region 37, respectively, and SG(10) and CG(9) correspond to the short-circuit gate electrode and the MOS control gate electrode, respectively. The n-channel MOSFET is formed between the cathodes K1 and K2, whereas the p-channel MOSFET is formed between the first gate region (31) and the second gate region (32). The n-MOS channel is formed between the cathode region (2) and the anode region (1) just under the control gate electrode 9. The substrate region of the n-channel MOSFET between the cathodes K1 and K2 can be regarded as the second gate region (32) and the substrate region of the p-channel MOSFET between the first and second gate regions 31 and 32 can be regarded as the high-resistivity layer 5 equipotential to the auxiliary cathode region 37. The main thyristor is turned ON and OFF by ON-OFF control of the n-channel MOSFET, the n-MOS channel and the p-channel MOSFET.

[Embodiment 12]

Figure 15:
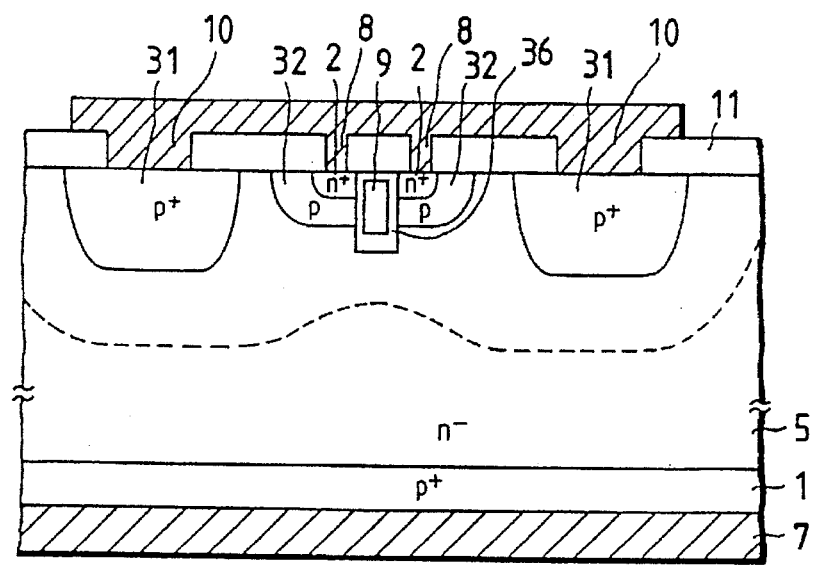
FIG. 15 is a sectional view schematically showing a twelfth embodiment of the present invention.

FIG. 15 schematically illustrates, in section, the insulated gate static induction thyristor with a split gate type shorted cathode structure according to a twelfth embodiment of the present invention. This enbodiment has its feature in that the control gate electrode 9 has a vertical structure. That is, an n-channel MOSFET of a structure [n⁺(2)p(32)n⁻(5)] is formed vertically. Since the first and second gate regions 31 and 32 are capacitively coupled, holes stored in the latter can be absorbed into the former. The illustrated structure can be considered as an example in which the first gate region 31 is provided as a planar structure and the second gate region 32 as a vertical structure. Of course, the second gate region 32 may be shorted to the cathode region 2.

[Embodiment 13]

Figure 16:
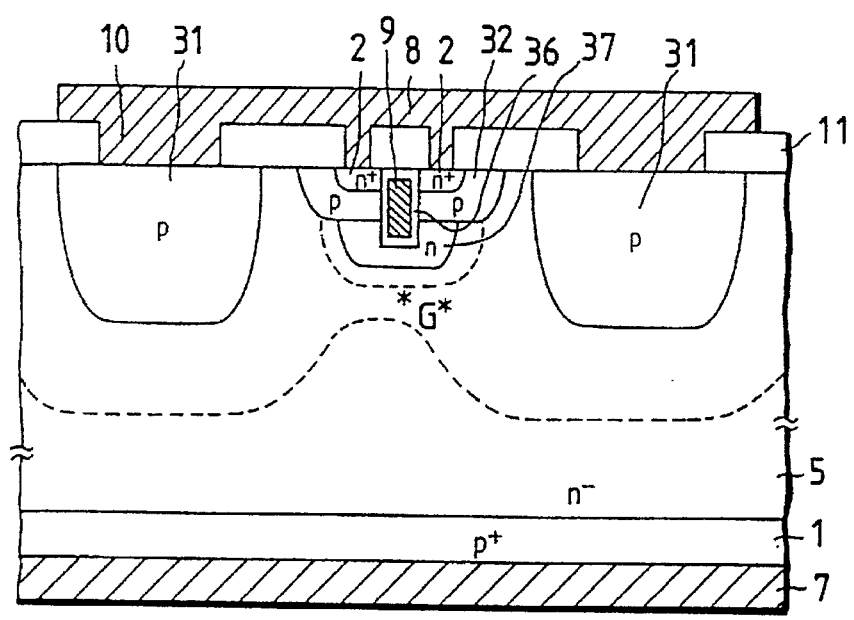
FIG. 16 is a sectional view schematically showing a thirteenth embodiment of the present invention.

FIG. 16 schematically illustrates, in section, the insulated gate static induction thyristor with a split gate type shorted cathode structure according to a thirteenth embodiment of the present invention. In this embodiment, an n-channel MOSFET of a structure [n⁺(2)p(32)n(37)] is provided vertically together with the insulating gate film 36 and the gate electrode 9. The n-type region 37 is the auxiliary cathode region, which can be regarded as a region in which electrons injected from the cathode region 2 are stored. Needless to say, the second gate region 32 may be electrically shorted to the cathode region 2.

[Embodimen 14]

Figure 17:
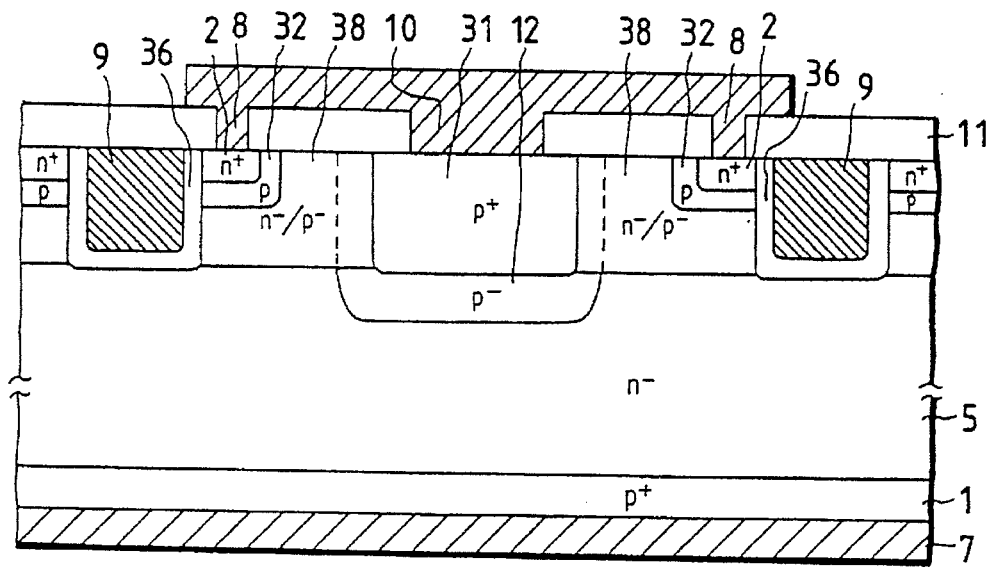
FIG. 17 is a sectional view schematically showing a fourteenth embodiment of the present invention.

FIG. 17 schematically illustrates, in section, the insulated gate static induction thyristor with a split gate type shorted cathode structure according to a fourteenth embodiment of the present invention. This embodiment has its structual feature in that the first gate region 31 is formed as a planar gete structure and the control gate electrode 9 as a vertical structure. The first and second gate regions 31 and 32 are separated by a p⁻/n⁻ high-resistivity layer 38 formed by the epitaxial growth technique, for example. The first gate region 31 is electrically shorted via the cathode short-circuit electrode 10 to the cathode region 2. The second gate region 32 and the control gate electrode 9 constitute a vertical MOS structure having the insulating layer 36 interposed between them. In this embodiment, there is further provided the low impurity concentration gate region (p⁻) 12 betweeen the first gate region 31 and the high-resistivity layer 5. The low impurity concentration gate region 12 allows the first gate region 31 to absorb thereinto holes in a deeper and wider region and acts to alleviate the high intensity electric field across the first gate region 31 and the anode region 1, as described previously. Various structural modifications of this embodiment can be effected; for example, if the first gate region 31 is formed on a side wall of a groove cut in the wafer substantially vertically, a recessed split gate structure will be obtained.

[Enbodiment 15]

Figure 18:
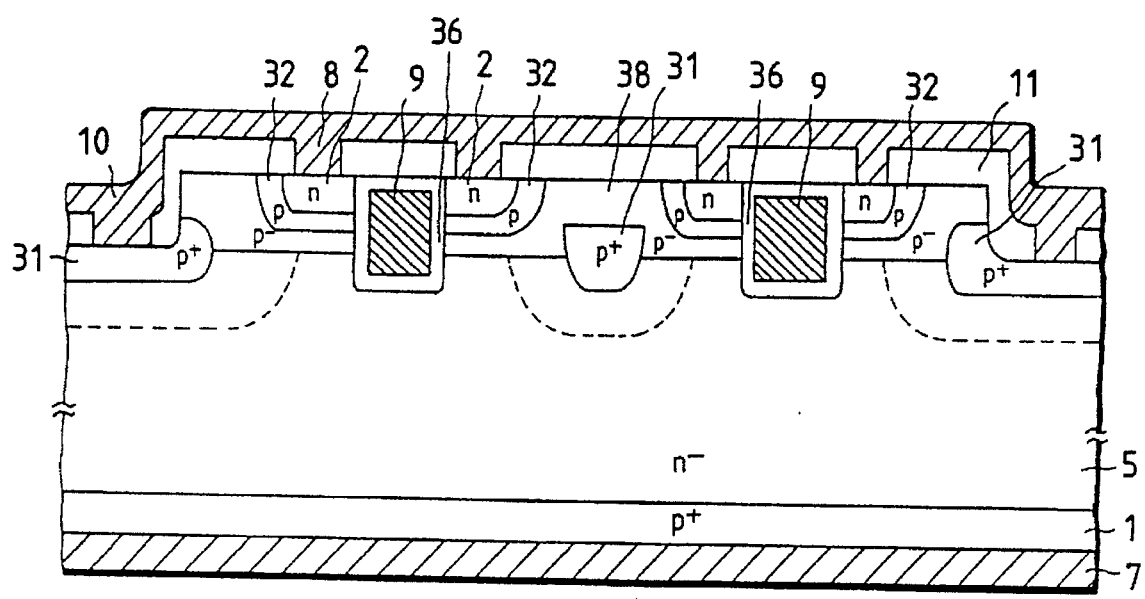
FIG. 18 is a sectional view schematically showing a fifteenth embodiment of the present invention.

FIG. 18 schematically illustrates, in section, the insulated gate static induction thyristor with a split gate type shorted cathode structure according to a fifteenth embodiment of the present invention. In this embodiment, the first gate region 31 is formed as a buried structure and the MOS gate electrode 9 as a vertical structure. In this instance, the flow of carriers passing through the channel is controlled by the buried p⁺-type first gate region 31. Hence, the short-circuit gate (i.e. the first gate region) 31 in the split gate structure can also be buried as shown in FIG. 18, wherein the buried gate region 31 is connected to the gate electrode 9. This connection can be made through a common diffused layer or electrode. In this embodiment the high-resistivity layer (n⁻/p⁻) 38 is interposed between the first and second gate regions 31 and 32 as in the FIG. 17 embodiment. Moreover, there is formed a vertical n-channel MOSFET of a structure [n(2)p(32)p⁻(38)n⁻(5)].

[Embodiment 16]

Figure 19:
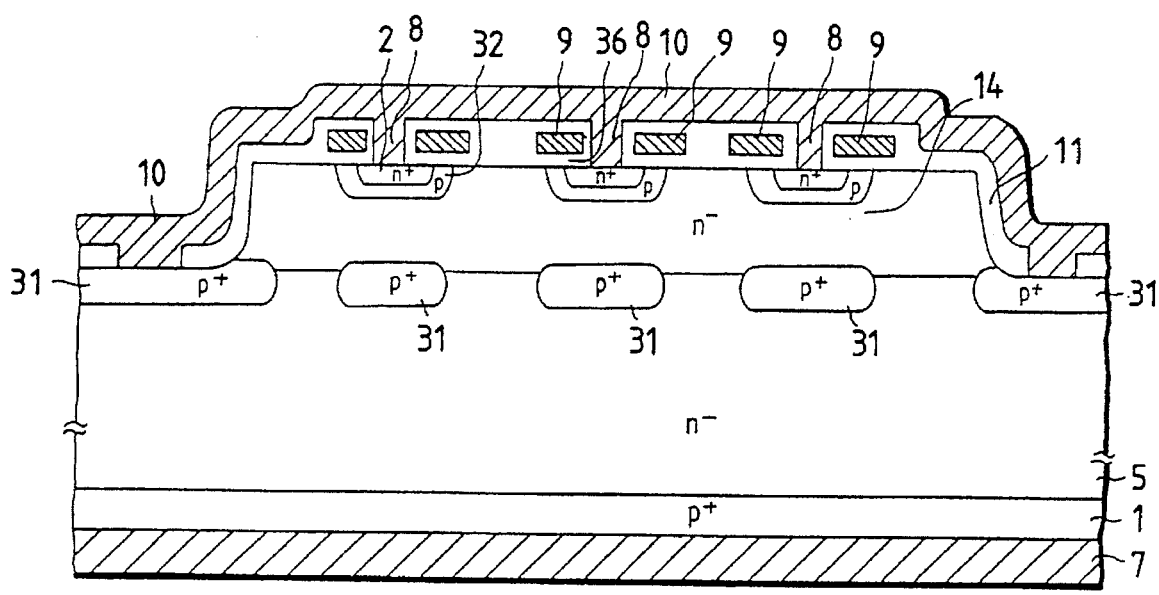
FIG. 19 is a sectional view schematically showing a sixteenth embodiment of the present invention.

FIG. 19 schematically illustrates, in section, the insulated gate static induction thyristor with a split gate type shorted cathode structure according to a sixteenth embodiment of the present invention. This embodiment has its feature in that the first gate region 31 is formed as a buried gate structure and the second gate region 32 and the MOS gate electrode 9 as a planar structure. An n⁻-type layer 14 is formed through epitaxial growth, for example. The first gate region 31 serves to absorb holes. Of course, the second gate region 32 may be electrically shorted to the cathode region 2. With the illustrated construction, electrons injected from the cathode region 2 will flow to the cathode side, passing through regions between the p⁺-type buried layers 31. The number of electrons that are injected could be increased by increasing the impurity concentration of the n-type epitaxial layer 14, and the auxiliary gate region 37 may also be provided. The spacing of the buried layers 31 can also be increased. The structure of this embodiment could easily be fabricated by the combined use of ordinary buried gate type static induction thyristor manufactureing techniques and MOS device manufacturing techniques.

[Embodiment 17]

Figure 20:
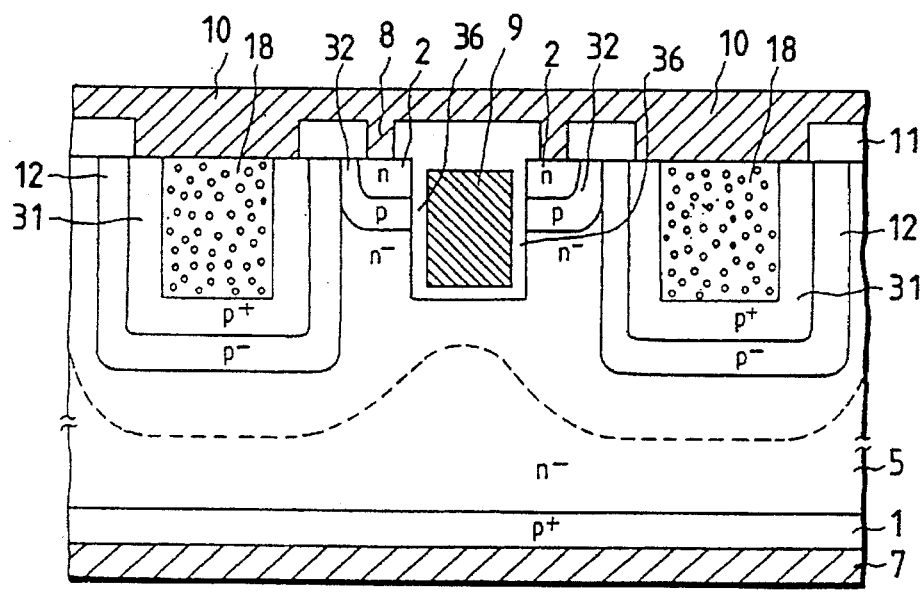
FIG. 20 is a sectional view schematically showing a seventeenth embodiment of the present invention.

FIG. 20 schematically illustrates, in section, the insulated gate static induction thyristor with a split gate type shorted cathode structure according to a seventeenth embodiment of the present invention. In this embodiment, the first gate region 31 is provided as a recessed gate structure. That is, the first gate region 31 is formed on the side wall and the bottom of a vertically recessed groove, the remaining void of the groove being filled with poly-silicon as indicated by 18. The second gate region 32 is formed relatively shallow, and a vertical MOSFET [n(2)p(32)n⁻(5)] is formed. Moreover, the low impurity concentration gate region 12 is provided around the first gate region 31 to absorb thereinto holes from a wider region and to relax the high intensity electric field that is applied to the first gate region 31. Needless to say, the auxiliary cathode region 37 may be provided. The vertical MOS structure in this embodiment is formed in the same manner as in the embodiments of FIGS. 15 to 18.

[Embodiment 18 and 19]

Figure 21:
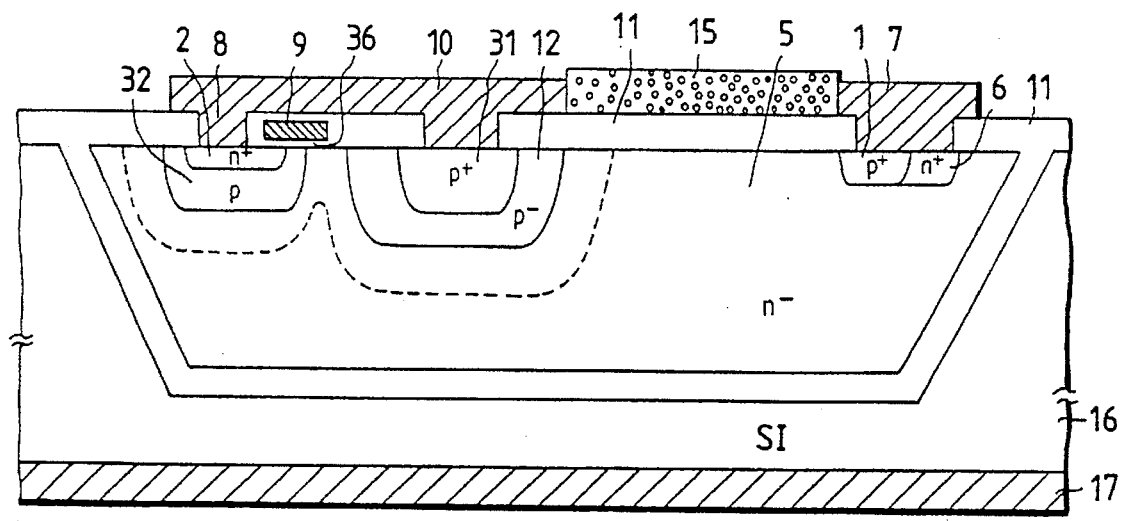
FIG. 21 is a sectional view schematically showing an eighteenth embodiment of the present invention.
Figure 22:
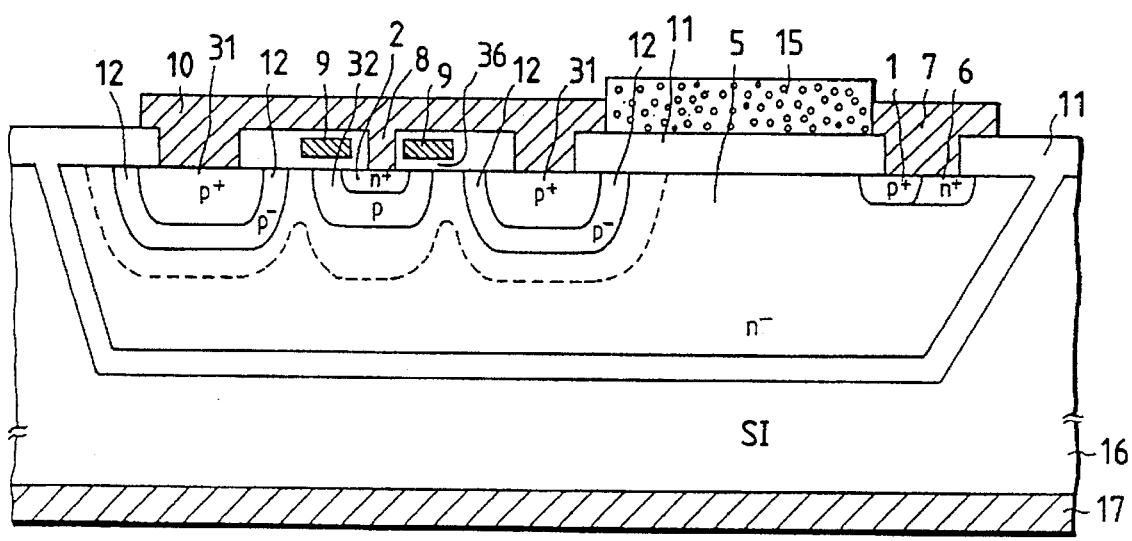
FIG. 22 is a sectional view schematically showing a nineteenth embodiment of the present invention.

FIGS. 21 and 22 schematically illustrate, in section, the insulated gate static induction thyristors with a split gate type shorted cathode structure according to eighteenth and nineteenth embodiment of the present invention, respectively. In either embodiment, the device is formed laterally in a single crystal mesa region (the high-resistivity layer 5) defined by an insulating layer 11 in a dielectric isolated (DI) substrate or semi-insulating substrate 16.

In FIG. 21 there is shown the insulated gate static induction thyristor of a lateral structure formed in the high-resistivity layer (n⁻) 5. The first gate region 31 is surrounded by the low impurity concentration layer 12, whereas the second gate region 32 is combined with the MOS gate electrode 9 to control the electron injection from the cathode region 2. The anode region 1 is shorted to the anode short-circuit region 6 via the anode electrode 7. Reference numeral 15 denotes an SIPOS film deposited on the insulating layer 11 to stabilize the high intensity electric field distribution in the lateral direction across the cathode and the anode.

In FIG. 22 the first gate region 31 is disposed at either side of the second gate region 32 in the structure of FIG. 21. This arrangement doubles the number of channels and essentially increases the areas of the second gate region 32 and the low impurity concentration gate region 12. Hence, the controllability of the electron current from the cathode region 2 by the second gate region 32 and the MOS gate electrode 9 is enhanced, and the first gate region 31 is allowed to absorb a larger number of holes. Thus, the minority carrier storage effect is suppressed so much that the switching performance or capability is improved and the maximum controllable current/voltage durability is increased.

In Embodiments 18 and 19 depicted in FIGS. 21 and 22, since the device structure is a planar lateral structure, it must be made multi-channel in the case of setting the current capacity to a large value.

[Embodiment 20]

Figure 23:
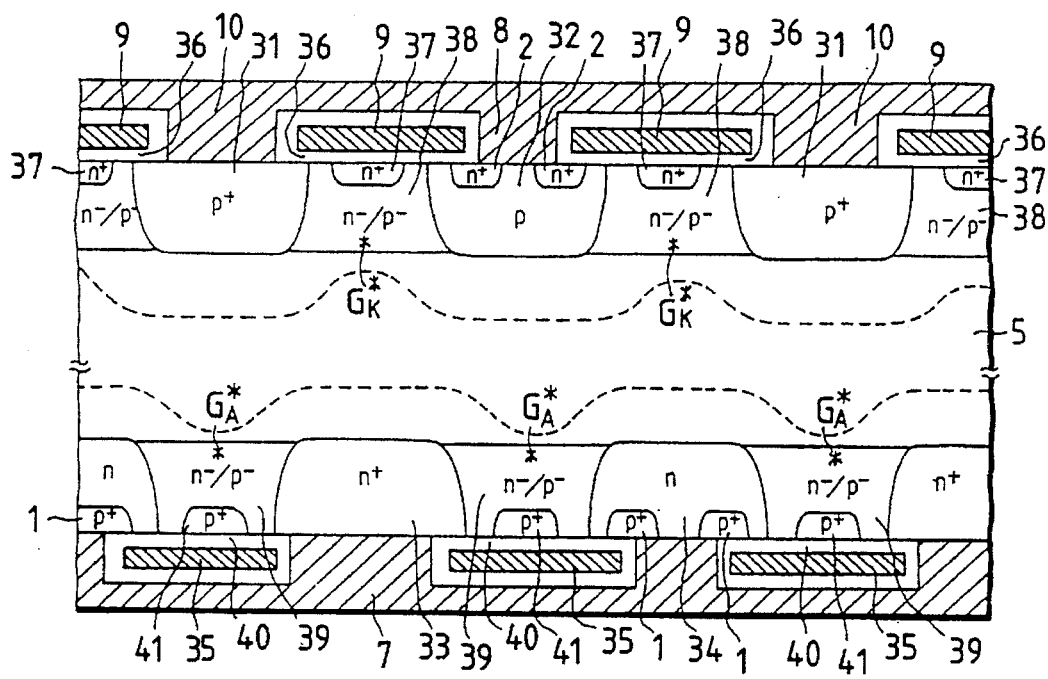
FIG. 23 is a sectional view schematically showing a twentieth embodiment of the present invention.

FIG. 23 schematically illustrates, in section, the insulated gate static induction thyristor with a split gate type shorted cathode structure according to a twentieth embodiment of the present invention. This embodiment has, as is evident from FIG. 23, a double gate structrue, wherein the p-type gate region (31, 32) at the cathode side and the n-type gate region (33, 34) at the anode side each have a split gate structue. That is, the first gate region (n⁺-type) 31 is shorted to the cathode region (n⁺-type) 2 via the short-circuit electrode 10, whereas the second gate (p-type) region 32 is covered with the control gate electrode 9 separated therefrom by the gate oxide film 36. The first gate region (n⁺-type) 33 at the anode side is shorted to the anode region 1 via the anode electrode 7, whereas the second gate region (n-type) 34 at the anode side is covered with a second control gate electrode 35 separated therefrom by a gate oxide film 40. Reference numeral 37 denotes an auxiliary cathode region and 41 an auxiliary anode region (p⁺-type). The double gate thyristor of this embodiment is ON-OFF controlled via the control gate electrode 9 and the second control gate 35. The first control gate electrode 9 is used to control n- and p-MOS structures and the second control gate electrode 35 is similarly used to control p- and n-MOS structures. The first gate region 33 at the anode side is shorted to the anode region 1 via the anode electrode 7 with a view to absorbing electrons which are minority carriers near the anode region 1 Since the electrons near the anode region 1 are absorbed by the anode-side first gate region 33 and holes near the cathode region 2 are absorbed by the first gate region 31, the thyristor of this embodiment is virtually free from the minority carrier storage effect, and hence is very high in switching speed. The holes injected from the anode side mostly flow to the first gate region 31, whereas the electrons injected from the cathode side mostly flow to the anode-side first gate region 33. Since such an effect of the shorted gate structure is provided at both of the cathode side and the anode side, the maximum controllable current/voltage durability is also high. In FIG. 23, n⁻/p⁻-type layers 38 and 39 are high-resistivity epitaxial layers, which are formed thin independently of the high-resistivity layer 5. The capacitive coupling between the first and second gate regions is taken into condsideration in this case, too.

[Embodiment 21]

Figure 24:
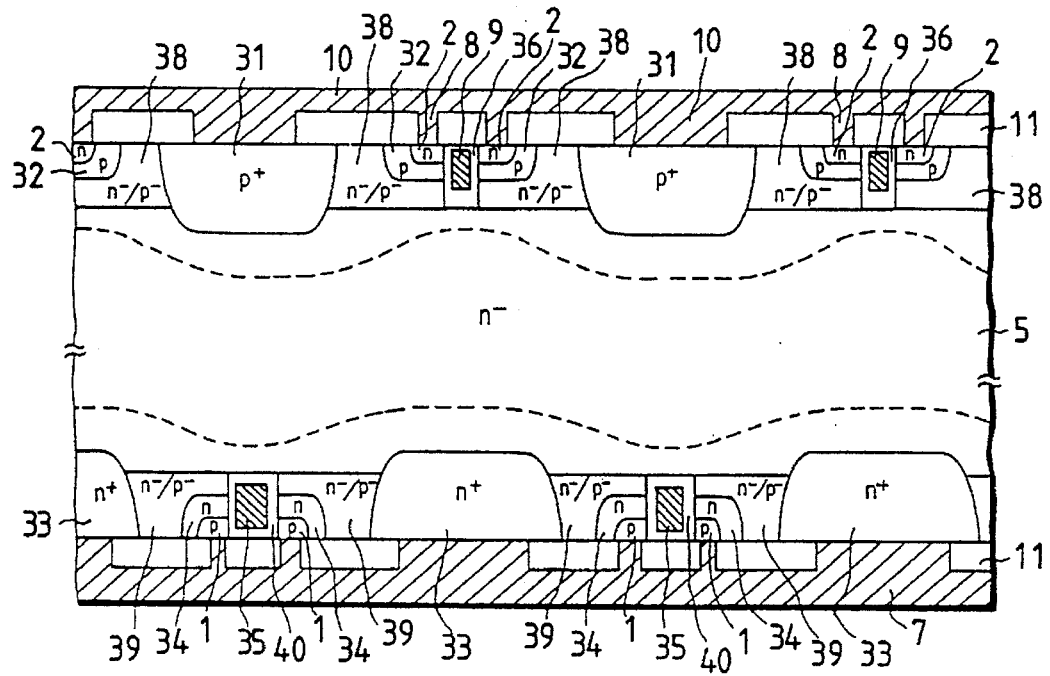
FIG. 24 is a sectional view schematically showing a twenty-first embodiment of the present invention.
Figure 25:
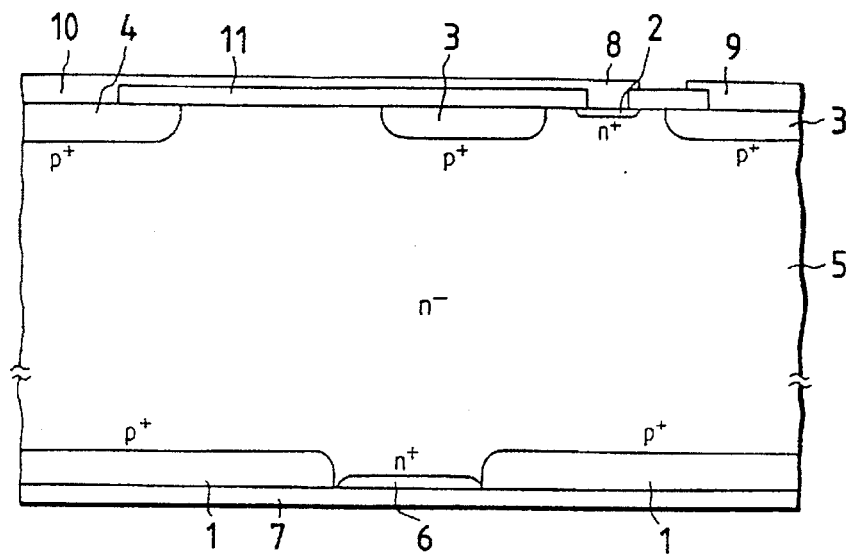
FIG. 25 is a sectional view schematically showing a conventional static induction thyristor with a double emitter-shorted structure.

FIG. 24 schematically illustrates, in section, the insulated gate static induction thyristor with a split gate type shorted cathode structure according to a twenty-first embodiment of the present invention. In contrast to Embodiment 20 which employs the planar structure for both of the anode-side gate and the cathode-side gate, this embodiment uses the planar structure for the first gates and the vertical structure for the second gates. The gate at the cathode side is composed of the first gate (p⁺-type) region 31, the second gate (p-type) region 32 and the MOS control gate electrode 9, whereas the gate at the anode side is composed of the first gate (n⁺-type) region 33, the second gate (n-type) region 34 and the MOS control gate electrode 35. The first gate region31 is shorted to the cathode region 2 via the cathode short-circuit electrode 10, and the second gate region 32, the insulating film 36 and the control gate electrode 9 constitute a vertical MOS structure. The anode-side first gate region 33 is shorted to the anode region 1 via the anode electrode 7, and the anode-side second gate region 34, the insulating film 40 and the second control gate electrode 35 constitute a vertical MOS structure. The n⁻/p⁻-type layers 38 and 39 are high-resistivity epitaxial layers.

Embodiments 20 and 21 employs the split gate type shorted anode structure in combination with the split gate type shorted cathode structure. By implementing, at either of the anode side and the cathode side, the structure wherein one of the two split control gate regions is shorted to the main electrode to form a shorted gate electrode and the other is formed as a true current control electrode of the MOS structure, the minority carrier (holes and electrons) storage effect is suppressed to permit high speed switching of the thyristor, besides the maximum controllable current/voltage durability is increased by the shorted cathode and shorted anode structures.

The present invention is not limited specifically to Embodiments 1 through 21 described above but various modifications and extensions may be effected by setting the number of channels, gate dimensions, thicknesses of the high-resistivity layers and the epitaxial layers, etc. in accordance with desired current capacity and withstand voltage.

The semiconductor meterial for implementing the present invention is not limited specifically to silicon either; it is a matter of course that GaAs, InP and similar materials can be used.

Moreover, it is apparent that a buffer structure, an SI buffer structure, a shorted structure, an SI shorted structure and an ordinary double gate structure may be introduced into the anode side. Of course, these structures may also be combined with carrier lifetime control techniques such as irradiation with electron beam protons or gamma rays, or diffusion of heavy metals (Au, Pt, etc.). It is evident that a lifetime distribution may be set vertically in the high-resistivity layer 5 by using these techniques in combination.

As described above, according to the insulated gate static induction thyristor with a split gate shorted cathode structure of the present invetnion, the high channel integration density increases the area efficiency, the introduction of the MOS gate structure in combination with the shorted structure suppresses the minority carrier storage effect to increase the switching speed and the shorted cathode structure increases the maximum controllable current/voltage durability. Moreover, the use of the MOS gate structure permits complete isolation of the short-circuit gate and the control electrode, and hence offers the advantage of enhanced controllability of the control electrode. The split gate structure can be used in combination with any of the planar, buried, recessed and double gate structures, and it can be applied to medium, small and large power semiconductor devices and high withstand voltage integrated circuits as well.

It will be apparent that many modifications and variations may be effected without departing from the scope of the novel concepts of the present invention.

What is claimed is:

1. An insulated gate static induction thyristor with a split gate type shorted cathode structure, comprising an anode region, a cathode region and a control region formed in a high-resistivity layer, wherein:

said control region includes first and second gate regions split therefrom;

said cathode region is formed in said second gate region;

a channel region is formed in said high-resistivity layer which is surrounded by said first and second gate regions;

a shield gate electrode formed in contact with said first gate region and a cathode electrode formed in contact with said cathode region are electrically shorted to each other to form a shorted cathode structure;

an insulated gate control gate electrode is formed above said second gate region with an insulating layer interposed therebetween to form an essentially insulated gate transistor between said cathode region and said high-resistivity layer, a current flow through said channel region between said cathode region and said anode region being controlled by a voltage which is applied to said insulated gate control gate electrode;

a first depletion layer by the contact potential between said first gate region and said high-resistivity layer and a second depletion layer by the contact potential between said second gate region and said high-resistivity layer are formed in said high-resistivity layer near said cathode region, said first and second depletion layer essentially contact each other enabling a potential of said second gate region to be controlled by a potential of said first gate region;

a potential barrier which is controllable by a static induction effect is formed in said channel region and a height of said potential barrier is static inductively controlled by a voltage which is applied to said insulated gate control gate electrode, holes injected from said anode region mainly flow through said first gate region and partly flow through said channel region and into said cathode electrode shorted to said shield gate electrode;

electrons injected from said cathode region mainly flow through said insulated gate transistor and said channel region;

an auxiliary cathode region of a same conductivity type as that of said cathode region is formed in a region of said high-resistivity layer which is surrounded by said first and second gate regions, and an essentially insulated gate transistor is formed between said auxiliary cathode region and said cathode by said second gate region and said insulated gate control gate electrode formed above said second gate region but isolated therefrom by said insulating layer; and wherein electrons injected from said cathode region are stored in said auxiliary cathode region, and a potential barrier which is controlled by said static induction effect is formed in said high-resistivity layer adjoining said auxiliary cathode region by said first and second depletion layers spreading from said first and second gate regions.

2. The thyristor of claim 1, wherein said insulated gate control gate electrode is extended over said high-resistivity layer surrounded by said first and second gate regions and over said first gate region, with an insulating layer interposed between them, thereby forming essentially an insulated gate transistor between said first and second gate regions.

3. The thyristor of claim 1, wherein said second gate region is electrically shorted to said cathode region via said cathode electrode.

4. The thyristor of claim 1, wherein said first gate region is formed larger than said second gate region including said cathode region.

5. The thyristor of claim 1, wherein said first gate region has an impurity concentration higher than that of said second gate region.

6. The thyristor of claim 1, wherein said first gate region includes a medium or low impurity concentration region of the same conductivity type as that of said first gate region and formed deeper than said second gate region and a high impurity concentration region formed in said medium or low impurity concentration region.

7. The thyristor of claim 1, wherein said first gate region is formed deeper and wider than said second gate region.

8. The thyristor of claim 1, wherein said first and second gate regions are each formed as a planar gate structure.

9. The thyristor of claim 1, wherein said first gate region has a buried gate structure.

10. The thyristor of claim 1, wherein said insulated gate control gate electrode has a recessed gate structure.

11. The thyristor of claim 1, wherein said cathode region, said anode region and said first and second gate regions are all formed near a same main wafer surface as a lateral structure.

12. The thyristor of claim 11, wherein said second gate region is electrically shorted to said cathode region via said cathode electrode.

13. The thyristor of claim 1, wherein:

said high-resistivity layer is formed in a dielectric substrate.

14. An insulated gate static induction thyristor, comprising:

a high-resistivity layer;

an anode region formed in said high-resistivity layer;

a control region including first and second gate regions spaced from each other and formed in said high-resistivity layer;

a cathode region formed in said second gate region;

a channel region in said high-resistivity layer defined by and surrounded by said first and second gate regions;

a shield gate electrode formed in contact with said first gate region;

a cathode electrode formed in contact with said cathode region, said shield gate electrode and said cathode electrode are electrically shorted to each other to form a shorted cathode structure;

an insulated gate electrode formed above said second gate region with an insulating layer interposed between said insulated gate electrode to form an essentially insulated gate transistor between said cathode region and said high-resistivity layer, a current flow through said channel region between said cathode region and said anode region being controlled by a voltage which is applied to said insulated gate electrode;

a first depletion layer formed in said high-resistivity layer adjacent said cathode region by a contact potential between said first gate region and said high-resistivity layer, a second depletion layer formed in said high-resistivity layer adjacent said cathode region by another contact potential between said second gate region and said high-resistivity layer, said first and second gate regions being formed in said high-resistivity layer to cause said depletion layers to essentially contact each other and to enable a potential of said first gate region to control a potential of said second gate region;

said first and second gate regions, said cathode region, said anode region and said insulated gate electrode being formed to cause holes injected from said anode region to mainly flow through said first gate region and partly flow through said channel region and into said cathode electrode shorted to said shield gate electrode;

an auxiliary cathode region of a same conductivity type as that of said cathode region is formed in a region of said high-resistivity layer surrounded by said first and second gate regions, said auxiliary cathode region is formed to create an essentially insulated gate transistor between said auxiliary cathode region, said cathode by said second gate region and said insulated gate electrode, said auxiliary cathode region is also formed to cause electrons injected from said cathode region to be stored in said auxiliary cathode region and to cause a potential barrier controllable by a static induction effect to be formed in said channel region adjoining said auxiliary cathode region by said first and second depletion layers spreading from said first and second gate regions.

15. A thyristor in accordance with claim 14, wherein:

said first and second gate regions, said cathode region, said anode region and said first and second gate regions are formed in said high-resistivity layer to cause a potential barrier which is controllable by a static induction effect to be created in said channel region and a height of said potential barrier is static inductively controlled by a voltage applied to said insulated gate electrode;

said first and second gate regions, said cathode region, said anode region and said insulated gate electrode are also formed to cause electrons injected from said cathode region to mainly flow through said insulated gate transistor and said channel region.

16. An insulated gate static induction thyristor, comprising:

a high-resistivity layer;

an anode region formed in said high-resistivity layer;

a control region including first and second gate regions spaced from each other and formed in said high-resistivity layer;

a cathode region formed in said second gate region;

a channel region in said high-resistivity layer defined by and surrounded by said first and second gate regions;

a shield gate electrode formed in contact with said first gate region;

a cathode electrode formed in contact with said cathode region, said shield gate electrode and said cathode electrode are electrically shorted to each other to form a shorted cathode structure;

an insulated gate electrode formed above said second gate region with an insulating layer interposed between said insulated gate electrode to form an essentially insulated gate transistor between said cathode region and said high-resistivity layer, a current flow through said channel region between said cathode region and said anode region being controlled by a voltage which is applied to said insulated gate electrode;

a first depletion layer formed in said high-resistivity layer adjacent said cathode region by a contact potential between said first gate region and said high-resistivity layer, a second depletion layer formed in said high-resistivity layer adjacent said cathode region by another contact potential between said second gate region and said high-resistivity layer, said first and second gate regions being formed in said high-resistivity layer to cause said depletion layers to essentially contact each other and to enable a potential of said first gate region to control a potential of said second gate region;

said first and second gate regions, said cathode region, said anode region and said insulated gate electrode being formed to cause holes injected from said anode region to mainly flow through said first gate region and partly flow through said channel region and into said cathode electrode shorted to said shield gate electrode;

an auxiliary cathode region of a same conductivity type as that of said cathode region is formed in a region of said high-resistivity layer surrounded by said first and second gate regions, said auxiliary cathode region is formed to create an essentially insulated gate transistor between said auxiliary cathode region and said cathode by said second gate region and said insulated gate electrode, said auxiliary cathode region is also formed to cause electrons injected from said cathode region to be stored in said auxiliary cathode region and to cause a potential barrier controllable by a static induction effect to be formed in said channel region adjoining said auxiliary cathode region by said first and second depletion layers spreading from said first and second gate regions, said insulated gate electrode being formed above said second gate region but isolated therefrom by said insulating layer; said potential barrier is formed in said high-resistivity layer.

17. The thyristor of claim 14, wherein said second gate region is electrically shorted to said cathode region via said cathode electrode.

18. The thyristor of claim 14, wherein said first gate region has an impurity concentration higher than that of said second gate region.

19. The thyristor of claim 14, wherein said first and second gate regions are each formed as a planar gate structure.

* * * * *